(12) United States Patent
Yang et al.

(10) Patent No.: US 8,847,315 B2
(45) Date of Patent: Sep. 30, 2014

(54) COMPLEMENTARY METAL-OXIDE-SEMICONDUCTOR (CMOS) DEVICE AND METHOD

(75) Inventors: Bin Yang, San Diego, CA (US); Xia Li, San Diego, CA (US); Jun Yuan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/465,064

(22) Filed: May 7, 2012

(65) Prior Publication Data

US 2013/0292767 A1 Nov. 7, 2013

(51) Int. Cl.
*H01L 27/12* (2006.01)
*H01L 29/47* (2006.01)
*H01L 29/10* (2006.01)
*H01L 29/66* (2006.01)
*H01L 21/8238* (2006.01)
*H01L 21/84* (2006.01)

(52) U.S. Cl.
CPC ............ *H01L 27/1211* (2013.01); *H01L 29/47* (2013.01); *H01L 29/1054* (2013.01); *H01L 27/1203* (2013.01); *H01L 29/66621* (2013.01); *H01L 21/823814* (2013.01); *H01L 21/84* (2013.01)
USPC ............ 257/347; 257/E27.064; 257/E21.633; 257/E21.634; 438/299; 438/300; 438/229

(58) Field of Classification Search
CPC ...................... H01L 29/66575; H01L 29/6659; H01L 29/6606; H01L 29/665
See application file for complete search history.

(56) References Cited

U.S. PATENT DOCUMENTS

| | | | |
|---|---|---|---|
| 6,815,297 B1 | 11/2004 | Krivokapic et al. | |
| 6,881,635 B1 * | 4/2005 | Chidambarrao et al. | ..... 438/300 |
| 7,465,634 B2 * | 12/2008 | Lim et al. | ..... 438/300 |
| 7,479,432 B2 * | 1/2009 | Murthy et al. | ..... 438/300 |
| 7,759,205 B1 | 7/2010 | Maitra et al. | |
| 7,807,538 B2 * | 10/2010 | Yamauchi et al. | ..... 438/300 |
| 7,851,289 B2 * | 12/2010 | Noguchi et al. | ..... 438/199 |
| 7,871,869 B2 | 1/2011 | Cartier et al. | |

(Continued)

FOREIGN PATENT DOCUMENTS

JP 2005183835 A 7/2005

OTHER PUBLICATIONS

Partial International Search Report—PCT/US2013/039947—ISA/EPO—Jul. 18, 2013.

(Continued)

*Primary Examiner* — Matthew W Such
*Assistant Examiner* — Samuel Lair
(74) *Attorney, Agent, or Firm* — Sam Talpalatsky; Nicholas J. Pauley; Joseph Agusta

(57) ABSTRACT

A complementary metal-oxide-semiconductor (CMOS) device and methods of formation thereof are disclosed. In a particular embodiment, a CMOS device includes a silicon substrate, a dielectric insulator material on the silicon substrate, and an extension layer on the dielectric insulator material. The CMOS device further includes a gate in contact with a channel and in contact with an extension region. The CMOS device also includes a source in contact with the extension region and a drain in contact with the extension region. The extension region includes a first region in contact with the source and the gate and includes a second region in contact with the drain and the gate.

13 Claims, 18 Drawing Sheets

(56) References Cited

U.S. PATENT DOCUMENTS

| | | | |
|---|---|---|---|
| 8,008,138 B2 | 8/2011 | Cheng et al. | |
| 8,114,727 B2 * | 2/2012 | Xiong et al. | 438/199 |
| 8,207,030 B2 * | 6/2012 | Brunco et al. | 438/199 |
| 8,455,952 B2 * | 6/2013 | Lin et al. | 257/369 |
| 8,679,910 B2 * | 3/2014 | Ming et al. | 438/224 |
| 2003/0162358 A1 | 8/2003 | Hanafi et al. | |
| 2005/0090066 A1 | 4/2005 | Zhu et al. | |
| 2007/0099369 A1 * | 5/2007 | Ning | 438/199 |
| 2007/0184601 A1 * | 8/2007 | Zhang et al. | 438/199 |
| 2008/0085577 A1 * | 4/2008 | Shih et al. | 438/199 |
| 2008/0179627 A1 * | 7/2008 | Ieong et al. | 257/190 |
| 2009/0039426 A1 * | 2/2009 | Cartier et al. | 257/344 |
| 2009/0065809 A1 | 3/2009 | Yamakawa | |
| 2009/0256178 A1 * | 10/2009 | Matsuo et al. | 257/288 |
| 2011/0024840 A1 | 2/2011 | Khater | |
| 2011/0037125 A1 | 2/2011 | Cheng et al. | |
| 2011/0042744 A1 | 2/2011 | Cheng et al. | |
| 2011/0227157 A1 | 9/2011 | Yang et al. | |
| 2011/0227170 A1 | 9/2011 | Zhu et al. | |
| 2011/0233688 A1 * | 9/2011 | Ren et al. | 257/408 |
| 2011/0291184 A1 | 12/2011 | Yin et al. | |
| 2011/0309446 A1 | 12/2011 | Doris et al. | |
| 2011/0312145 A1 * | 12/2011 | Tsai et al. | 438/300 |
| 2012/0025266 A1 * | 2/2012 | Griebenow et al. | 257/190 |
| 2012/0061759 A1 | 3/2012 | Cheng et al. | |
| 2012/0104470 A1 | 5/2012 | Ponoth et al. | |
| 2012/0153399 A1 * | 6/2012 | Hoentschel et al. | 257/369 |

OTHER PUBLICATIONS

International Search Report and Written Opinion—PCT/US2013/039947—ISA/EPO—Nov. 19, 2013.

* cited by examiner

COMPLEMENTARY METAL-OXIDE-SEMICONDUCTOR (CMOS) DEVICE AND METHOD

I. FIELD

The present disclosure is generally related to a complementary metal-oxide-semiconductor (CMOS) device and formation thereof.

II. DESCRIPTION OF RELATED ART

Extremely Thin Silicon on Insulator (ETSOI) complementary metal-oxide-semiconductor (CMOS) devices provide flexibility in establishing operating parameters. The ETSOI CMOS may provide flexibility by utilizing a "back" gate (BG) on a particular transistor that may be biased independent of a "top" gate of the particular transistor to change a threshold voltage (Vt) and a turn-on current (Ion) of the particular transistor. Thus, the threshold voltage (Vt) is tunable for the particular transistor of the ETSOI CMOS. Additionally, the ETSOI CMOS may provide enhanced channel control and may limit Short-Channel Effects (SCE) for each transistor of the ETSOI CMOS due in part to the thin channel region of the ETSOI CMOS.

However, performance of an ETSOI CMOS device may be limited in low power applications by a high resistance of an extension region (Rext) of the ETSOI CMOS device. Conventionally, a thin extension region contributes to the high resistance of the extension region (Rext) and creates a "bottleneck" issue for both p-type metal-oxide-semiconductor (pMOS) and n-type metal-oxide-semiconductor (nMOS) regions of the ETSOI CMOS device. The difficulty in resolving the high resistance of the extension region (Rext) is compounded when changing a characteristic of one of the pMOS transistor and the nMOS transistor. Changing a characteristic of one of the pMOS transistor and the nMOS transistor may not improve the high resistance of the extension region (Rext) in the other transistor or may negatively impact performance of the other transistor.

III. SUMMARY

A method of fabricating a complementary metal-oxide-semiconductor (CMOS) device (e.g., a CMOS flow) includes forming a CMOS device including a silicon on insulator (SOI) wafer such as an extremely thin silicon on insulator (ETSOI) wafer. The CMOS device includes a first transistor of a first type and a second transistor of a second type. Each of the first transistor and the second transistor includes a gate where a bottom of the gate is in contact with a channel region and a portion of a side of the gate is in contact with an extension region. The extension region may include a raised source/drain region or the raised source/drain region may be formed above the extension region. Additionally, an extension region of the first transistor is complementary to an extension region of the second transistor. For example, the extension region of the first transistor may include silicon germanium (SiGe) when the first transistor is a p-type transistor and the extension region of the second transistor may include silicon (Si) or silicon carbon (Si:C) when the second transistor is an n-type transistor.

In a particular embodiment, a complementary metal-oxide-semiconductor (CMOS) device is disclosed. The CMOS device includes a silicon substrate, a dielectric insulator material on the silicon substrate, and an extension layer on the dielectric insulator material. The CMOS device further includes a gate in contact with a channel and in contact with an extension region. The CMOS device also includes a source in contact with the extension region and a drain in contact with the extension region. The extension region includes a first region in contact with the source and the gate and includes a second region in contact with the drain and the gate.

In another particular embodiment, a complementary metal-oxide-semiconductor (CMOS) device includes a substrate, a dielectric insulator material on the substrate, and a channel region and an extension region on the dielectric insulator material. The CMOS device further includes a gate in contact with the channel region. The extension region includes a first region in contact with a source and the gate and includes a second region in contact with a drain and the gate.

In another particular embodiment, a method of forming a complementary metal-oxide-semiconductor (CMOS) device is disclosed. The method includes forming a first layer on an extension layer of a wafer and forming a first gate on a portion of the first layer. The method also includes forming an expansion region above the extension layer. The method further includes removing a portion of the first gate to establish a cavity and removing a portion of the first layer to extend the cavity to the extension layer.

In another particular embodiment, an apparatus includes a complementary metal-oxide-semiconductor (CMOS) device on a wafer including an extension layer. The CMOS device includes a first transistor and a second transistor. The first transistor includes a first gate on the extension layer and a first extension structure in contact with the first gate. The second transistor includes a second gate on the extension layer and a second extension structure in contact with the second gate. The second extension structure is complementary to the first extension structure.

In another particular embodiment, a method of forming a complementary metal-oxide-semiconductor (CMOS) device is disclosed. The method includes forming a first layer on an extension layer of a wafer. The extension layer includes a first region associated with a p-type transistor and a second region associated with an n-type transistor. The method also includes forming a gate on the first region. The gate is in contact with the extension layer and in contact with a first expansion structure that includes a portion of the first layer. The method further includes forming another gate on a second region. The other gate is in contact with the extension layer and in contact with a second expansion structure formed on a portion of the second region.

One particular advantage provided by at least one of the disclosed embodiments is that a semiconductor device (e.g., a CMOS device) is formed using a process (e.g., a CMOS flow) that resolves or reduces the extension region bottle-neck issues for both of a p-channel metal-oxide-semiconductor (pMOS) portion and an n-channel metal-oxide-semiconductor (nMOS) portion of the CMOS device. Another particular advantage provided by at least one of the disclosed embodiments is that the semiconductor device is designed to maintain a very thin channel while increasing a thickness of an extension region under a spacer of a gate stack to reduce the extension region bottle-neck issues and improve channel control (e.g., channel mobility). Another particular advantage provided by at least one of the disclosed embodiments is that an ETSOI CMOS device includes characteristics that improve performance in low power applications as compared to conventional ETSOI CMOS devices.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Particular embodiments of the present disclosure are described below with reference to the drawings. In the description, common features are designated by common reference numbers throughout the drawings.

Figure 1:
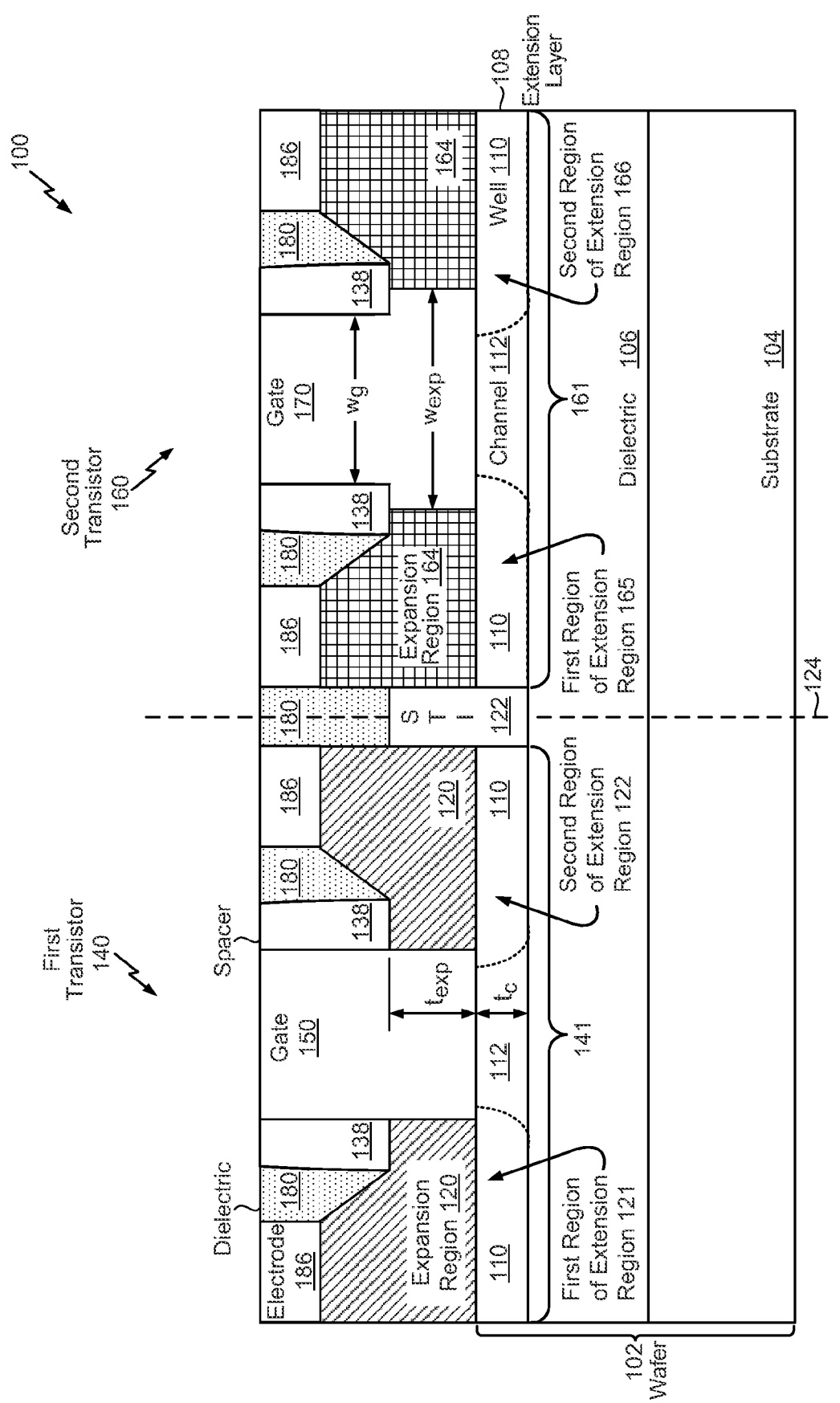
FIG. 1 is a block diagram of a particular illustrative embodiment of a complementary metal-oxide-semiconductor (CMOS) device.

Referring to FIG. 1, a particular illustrative embodiment of a complementary metal-oxide-semiconductor (CMOS) device (e.g., a silicon on insulator (SOI) CMOS device) is disclosed and generally designated 100. In a particular embodiment, the CMOS device 100 is an extremely thin silicon on insulator (ETSOI) CMOS device. The CMOS device 100 may include a wafer 102 onto which a first transistor 140 of a first type and a second transistor 160 of a second type are incorporated. In a particular embodiment, the first type of the first transistor 140 is a p-type and the second type of the second transistor 160 is an n-type. A dashed line 124 illustrates a representative logical division of the CMOS device 100 into an n-type portion and a p-type portion. One of skill in the art will appreciate that, although the CMOS device 100 depicts two transistors, the CMOS device 100 may include a plurality of transistors. For example, the CMOS device 100 may include a first plurality of p-type transistors and a second plurality of n-type transistors.

The CMOS device 100 may include a substrate 104, a dielectric insulator material 106, and an extension layer 108. In a particular embodiment, the substrate 104 includes silicon (Si), the dielectric insulator material 106 may include a buried oxide (BOX), and the extension layer 108 may include silicon (Si). In a particular embodiment, the substrate 104, the dielectric insulator material 106 on the silicon substrate 104, and the extension layer 108 are included in the wafer 102.

The wafer 102 may include an extremely thin silicon on insulator (ETSOI) wafer. The ETSOI wafer may include a silicon substrate, a dielectric layer, and the extension layer 108. The silicon substrate may include the substrate 104 and the dielectric layer may include the dielectric insulator material 106.

The extension layer 108 may include a first portion 141 corresponding to the first transistor 140 and a second portion 161 corresponding to the second transistor 160. The first portion 141 and the second portion 161 may be separated by a shallow trench isolation (STI) region 122. Each of the first portion 141 and the second potion 161 may include well implants 110 and a channel region 112 having a channel. Either well implant 110 of the first transistor 140 and the second transistor 160, respectively, may be associated with a source or associated with a drain of the corresponding transistor.

The first transistor 140 may include a gate 150 and source/drain electrodes 186 (e.g., a metal) depicted to the left of the dashed line 124. The gate 150 may be positioned on the channel region 112 of the first extension region 141. One of skill in the art will appreciate that either of the source/drain electrodes 186 of the first transistor 140 may operate as either a source or a drain of the first transistor 140.

The second transistor 160 of the second type may be disposed on the extension layer 108. In a particular embodiment, the second transistor 160 includes another gate 170 and source/drain electrodes 186 depicted to the right of the dashed line 124. The gate 170 may be positioned on the channel region 112 of the second extension region 161. One of skill in the art will appreciate that either of the source/drain electrodes 186 of the second transistor 160 may operate as either a source or a drain of the second transistor 160. One of skill in the art will further appreciate that the CMOS device 100 may include a back gate (not shown) that may be biased independent of the gate 150 and/or the gate 170.

Each of the gate 150 and the other gate 170 may have spacers 138 attached thereto. In a particular embodiment, a spacer 138 is attached to the gate 150 of the first transistor 140 and positioned between the gate 150 and a particular source/drain electrode 186. The CMOS device 100 may also include a dielectric 180 above the wafer 102. In a particular embodiment, the dielectric 180 is between the spacers 138 and the source/drain electrodes 186 as shown in FIG. 1.

An expansion region (e.g., an extended extension region) may be positioned above each of the first portion 141 of the extension layer 108 and the second portion 161 of the extension layer 108. In a particular embodiment, the first transistor 140 includes an expansion region 120 and the second transistor 160 includes an expansion region 164. The expansion region 120 of the first transistor 140 may be positioned above the well implants 110 of the first portion 141 of the extension layer 108. The second transistor 160 may include the expansion region 164 positioned above the well implants 110 of the second portion 161 of the extension layer 108. In a particular embodiment, the well implants 110 of the first portion 141 include p-type well implants and the well implants of the second portion 161 include n-type well implants. In a particular embodiment, the expansion region 120 of the first transistor 140 is complementary to the expansion region 164 of the second transistor 160. For example, the expansion region 120 may include silicon germanium or another material that increases a p-type metal-oxide-semiconductor (pMOS) channel mobility and the expansion region 164 may include silicon (Si), silicon carbon (Si:C), or another material that increases an n-type metal-oxide-semiconductor (nMOS) channel mobility.

In another particular embodiment, the first portion 141 of the extension layer 108 includes a material deposited thereon forming the expansion region 120 (e.g., an extended extension region) of the first transistor 140. The material of the expansion region 120 may include silicon germanium (SiGe). In another particular embodiment, the second portion 161 of the extension layer 108 has a material deposited thereon forming the expansion region 164 of the second transistor 160. The material of the expansion region 164 may include one of silicon (Si) and silicon carbon (Si:C) (e.g., carbon-doped silicon).

In a particular embodiment, each of the expansion regions 120 and 164 includes source/drain regions. The source/drain regions of the expansion regions 120 and 164 may include doped regions of the expansion regions 120 and 164. For example, the source/drain regions of the expansion regions 120 and 164 may be portions of the expansion regions 120 and 164 that are raised. In a particular embodiment, the source/drain regions of the expansion regions 120 and 164 are raised above the expansion layer 108. In another particular embodiment, the source/drain regions of the expansion regions 120 and 164 are top portions of the expansion regions 120 and 164 that are raised over bottom portions of the expansion regions 120 and 164. One of skill in the art will appreciate that the first transistor 140 and the second transistor 160 may each have two source/drain regions and that either source/drain region may operate as either a source or a drain.

An extension region of the first transistor 140 may include the expansion region 120 and the well implants 110 of the first portion 141 of the extension layer 108. The extension region of the first transistor 140 may include silicon (Si). In a particular embodiment, the extension region of the first transistor 140 includes a first region 121 and a second region 122. For example, the first region 121 of the extension region of the first transistor 140 may be depicted in FIG. 1 as a portion of the extension region of the first transistor 140 to the left of the gate 150. The second region 122 of the extension region of the first transistor 140 may be depicted in FIG. 1 as a portion of the extension region of the first transistor 140 to the right of the gate 150. In another particular embodiment, the extension region includes the first region 121 in contact with a source and the gate 150 and includes the second region 122 in contact with a drain and the gate 150.

An extension region of the second transistor 160 may include the expansion region 164 and the well implants 110 of the second portion 161 of the extension layer 108. The extension region of the second transistor 160 may include silicon (Si). The CMOS device 100 may further include a source in contact with the extension region and a drain in contact with the extension region. The extension region of the second transistor 160 may include a first region 165 and a second region 166. In a particular embodiment, the first region 165 of the extension region of the second transistor 160 is depicted in FIG. 1 as a portion of the extension region of the second transistor 160 to the left of the gate 170. The second region 166 of the extension region of the second transistor 160 may be depicted in FIG. 1 as a portion of the extension region of the second transistor 160 to the right of the gate 170. In another particular embodiment, the extension region of the second transistor 160 may include the expansion region 164 above the second portion 161 of the extension layer 108.

Referring to the first transistor 140 of FIG. 1, the channel region 112 may have a thickness $t_c$ and the expansion region 120 may have a thickness $t_{exp}$. One of skill in the art will appreciate that the expansion region 164 of the second transistor 160 may also have a thickness $t_{exp}$. The thickness $t_c$ of the channel region 112 may be a distance between a bottom surface of the channel region 112 proximate to the dielectric layer 106 and a top surface of the channel region 112 proximate to the gate 150. The thickness $t_{exp}$ of the expansion region 120 may be a distance between a bottom surface of the expansion region 120 proximate to the extension layer 108 and a bottom surface of the spacer 138. In a particular embodiment, the thickness $t_{exp}$ of the expansion region 120 is a shortest distance between the bottom surface of the expansion region 120 and the top surface of the expansion region 120. The thickness $t_c$ of the channel region 112 may be less than the thickness $t_{exp}$ of the expansion region 120. In a particular embodiment, the thickness $t_c$ of the channel region 112 is less than or equal to the thickness $t_{exp}$ of the expansion region 120. In another particular embodiment, the thickness $t_c$ of the channel region 112 is greater than or equal to the thickness $t_{exp}$ of the expansion region 120

Referring to the second transistor 160 of FIG. 1, the gate 170 may have a first width $w_g$ between spacers 138 and a second width $w_{exp}$ at the extension layer 108. The width $w_g$ of the gate 170 may be a distance between a first side of the gate 170 proximate to a first spacer 138 (depicted in FIG. 1 as the spacer 138 of the second transistor 160 to the left of the gate 170) and a second side of the gate 170 proximate to a second spacer 138 (depicted in FIG. 1 as the spacer 138 of the second transistor 160 to the right of the gate 170). The width $w_{exp}$ of the gate 170 may be a distance between a first side of the gate 170 that is adjacent to the expansion region 164 (depicted in FIG. 1 as a portion of the expansion region 164 to the left of the gate 170) and a second side of the gate 170 that is adjacent to the expansion region 164 (depicted in FIG. 1 as a portion of the expansion region 164 to the right of the gate 170). The width $w_g$ may be less than the width $w_{exp}$. In a particular embodiment, the width $w_g$ is less than or equal to the width $w_{exp}$. In another particular embodiment, the width $w_g$ is substantially equal to the width $w_{exp}$. One of skill in the art will appreciate that the gate 150 of the first transistor 140 may have a width $w_g$ and a width $w_{exp}$. In a particular embodiment, width $w_g$ of the gate 150 is substantially equal to the width $w_{exp}$ of the gate 150. In a particular embodiment, the width $w_g$ of the gate 150 is less than the width $w_{exp}$ of the gate 150.

During operation, the gates 150 and 170 and the source/drain electrodes 186 of the CMOS device 100 may be biased in accordance with operation of the CMOS device 100. The CMOS device 100 may include the expansion regions 120 and 164 above the extension layer 108 that are in contact with gates 150 and 170, respectively. For example, the expansion regions 120 and 164 may contact the gates 150 and 170 underneath the spacers 138 (e.g., extend between the spacers 138 and the extension layer 108). The extension layer 108 and the expansion regions 120 and 164 may both include silicon (Si). In a particular embodiment, the CMOS device 100 including a first transistor of a first type (e.g., a p-type metal-oxide-semiconductor (pMOS) device) and a second transistor of a second type (e.g., an n-type metal-oxide-semiconductor (nMOS) device) are operated in a low-power application.

A combined resistance established by the extension layer 108 and the expansion regions 120 and 164, respectively, is less than a high resistance of the extension layer 108 alone. Therefore, the CMOS device 100 having the expansion regions 120 and 164 above the extension layer 108 and in contact with the gates 150 and 170, respectively, does not suffer from the bottle-neck issues of conventional CMOS devices in both of a p-channel metal-oxide-semiconductor (pMOS) portion and an n-channel metal-oxide-semiconductor (nMOS) portion of the CMOS device 100. Accordingly, the CMOS device 100 is able to be operated in a low-power application.

Figure 2A:
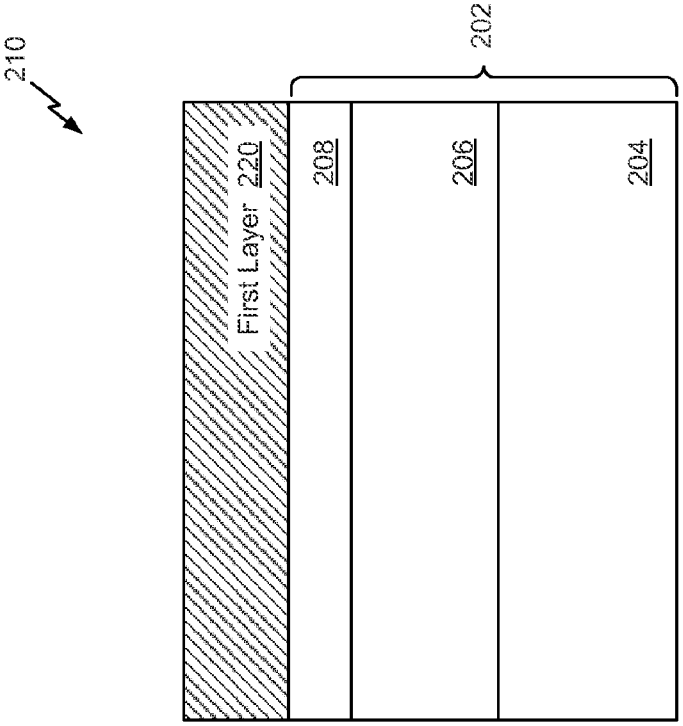
FIGS. 2A and 2B depict a first illustrative diagram and a second illustrative diagram of at least one stage in a process of fabricating a complementary metal-oxide-semiconductor (CMOS) device.
Figure 2B:
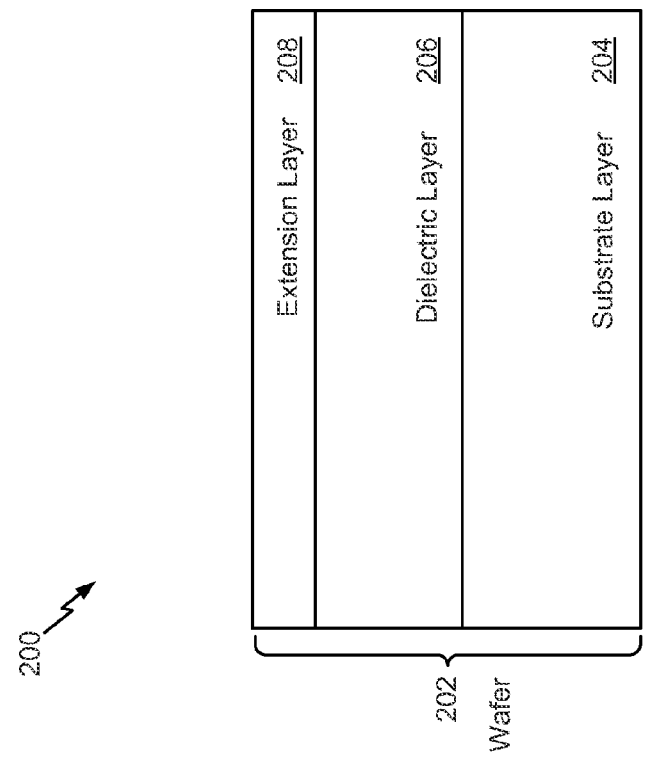

Referring to FIGS. 2A and 2B, a first illustrative diagram and a second illustrative diagram of at least two stages in a process of fabricating a complementary metal-oxide-semiconductor (CMOS) device, such as the CMOS device 100 of FIG. 1, are depicted and generally designated 200 and 210, respectively. Referring to FIG. 2A, a wafer 202 may include a silicon layer 204 (e.g., a silicon substrate), a dielectric layer 206, and an extension layer 208. The dielectric layer 206 may be positioned between the silicon layer 204 and the extension layer 208. For example, the wafer 202 may be the wafer 102 of FIG. 1. In a particular embodiment, the wafer 202 includes a silicon on insulator (SOI) structure. In another particular embodiment, the wafer 202 includes an extremely thin silicon on insulator (ETSOI) wafer structure.

Referring to FIG. 2B, a first layer 220 may be formed above the wafer 202. The first layer 220 may be epitaxially deposited (e.g., grown) on the extension layer 208. For example, the first layer 220 may include a portion of the expansion region 120 of FIG. 1. In a particular embodiment, the first layer 220 includes a silicon-containing layer. For example, the first layer 220 may include a layer of silicon germanium (SiGe). In another particular embodiment, the first layer 220 includes another material that increases a p-type metal-oxide-semiconductor (pMOS) channel mobility in a pMOS device (e.g., a p-type metal-oxide-semiconductor field effect transistor (pMOSFET) device).

In a particular embodiment, a thickness of the first layer 220 is greater than or equal to a thickness of the extension layer 208. For example, the extension layer 208 may have a thickness of 60-80 Angstroms and the first layer 220 may have a thickness of 60-100 Angstroms. In a further example, the first layer 220 may have a thickness of 60-80 Angstroms. In an additional example, the first layer 220 may have a thickness of less than about 80 Angstroms. In another particular embodiment, a thickness of the first layer 220 is less than or equal to a thickness of the extension layer 208. In another particular embodiment, one of the above-identified thicknesses may be utilized in an ETSOI CMOS device that is used in low-power applications.

Figure 3:
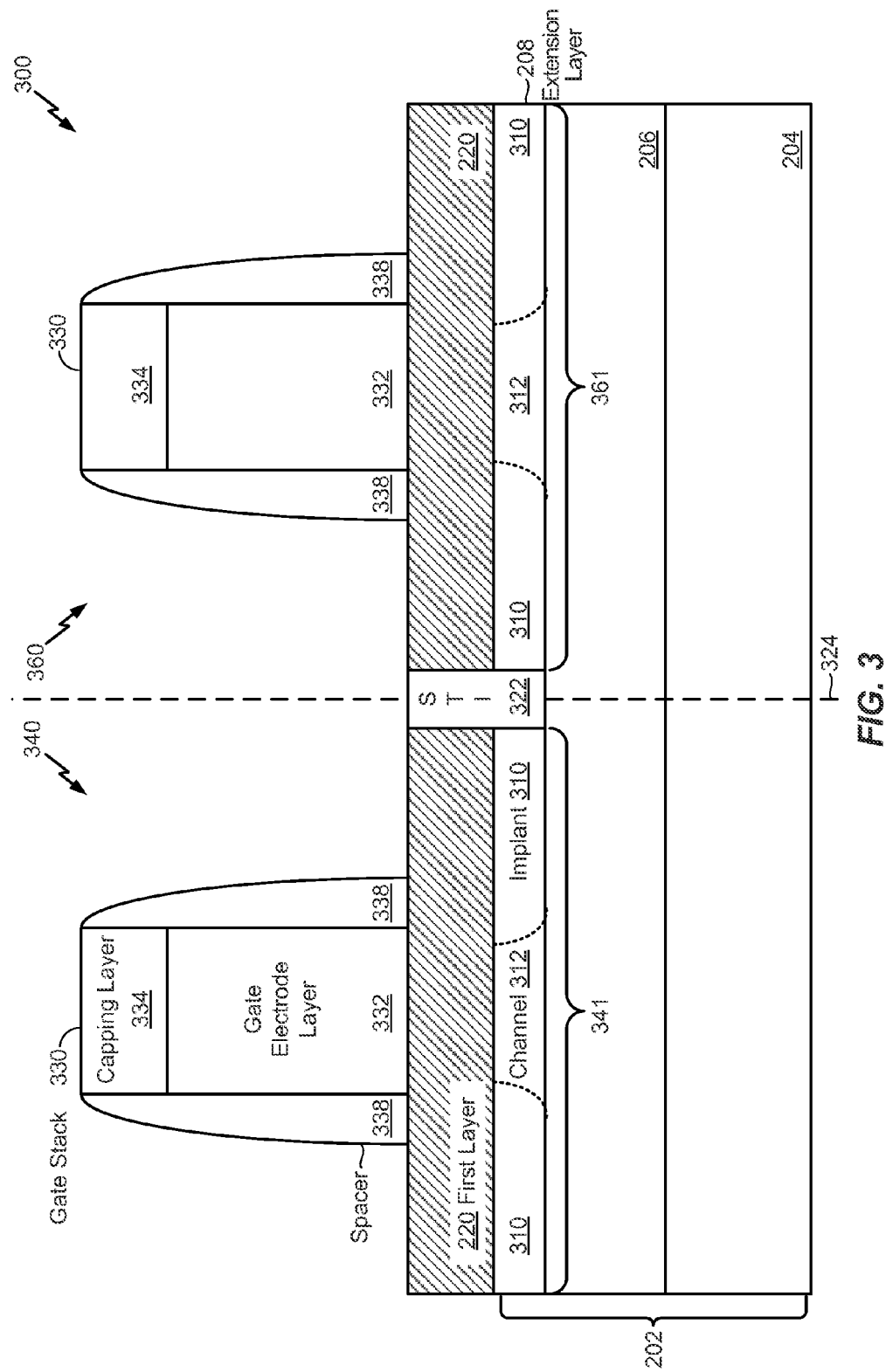
FIG. 3 is a third illustrative diagram of at least one stage in the process of fabricating a complementary metal-oxide-semiconductor (CMOS) device after forming one or more gate stacks on an extension layer of the CMOS device.

Referring to FIG. 3, a third illustrative diagram of at least one stage in the process of fabricating a complementary metal-oxide-semiconductor (CMOS) device is depicted and generally designated 300. A shallow trench isolation (STI) region 322, well implants 310, channel regions 312, gate stacks 330, and spacers 338 may be formed. For example, the STI 322, the well implants 310, the channel regions 312, and the spacers 338 may be the STI 122, the well implants 110, the channel regions 112, and the spacers 138 of FIG. 1, respectively. Back gate implantation, crystallization annealing, etching, patterning, and/or extension implantation may be performed as part of or in addition to forming one or more of the STI region 322, the well implants 310, the channel regions 312, the gate stacks 330, and the spacers 338.

The STI region 322 may be formed through the first layer 220 and the extension layer 208. The STI region 322 may divide the extension layer 208 into a first portion 341 and a second portion 361 as indicated by the dashed line 324. The first portion 341 may correspond to a first area 340 of the CMOS device and the second portion 361 may correspond to a second area 360 of the CMOS device. The first area 340 may be designated for a first transistor of a first type and the second area 360 may be designated for a second transistor of a second type. In a particular embodiment, the first transistor of the first type is a p-type metal-oxide-semiconductor (pMOS) device (e.g., a p-type metal-oxide-semiconductor field effect transistor (pMOSFET) device) such as the first transistor 140 of FIG. 1. In another particular embodiment, the second transistor of the second type is an n-type metal-oxide-semiconductor (nMOS) device (e.g., an n-type metal-oxide-semiconductor field effect transistor (nMOSFET) device) such as the second transistor 160 of FIG. 1.

The gate stacks 330 and spacers 338 may be formed above the first layer 220. Each of the gate stacks 330 may include a capping layer 334 and a gate electrode layer 332. The capping layer 334 may include silicon nitride (SiN). The gate electrode layer 332 may include amorphous silicon (a-Si) or polysilicon. The spacers 338 may include silicon nitride (SiN). In a particular embodiment, a first gate stack 330 of the first area 340 is formed above the first portion 341 of the extension layer 308 and a second gate stack 330 of the second area 360 is formed above the second portion 361 of the extension layer 308.

Figure 4:
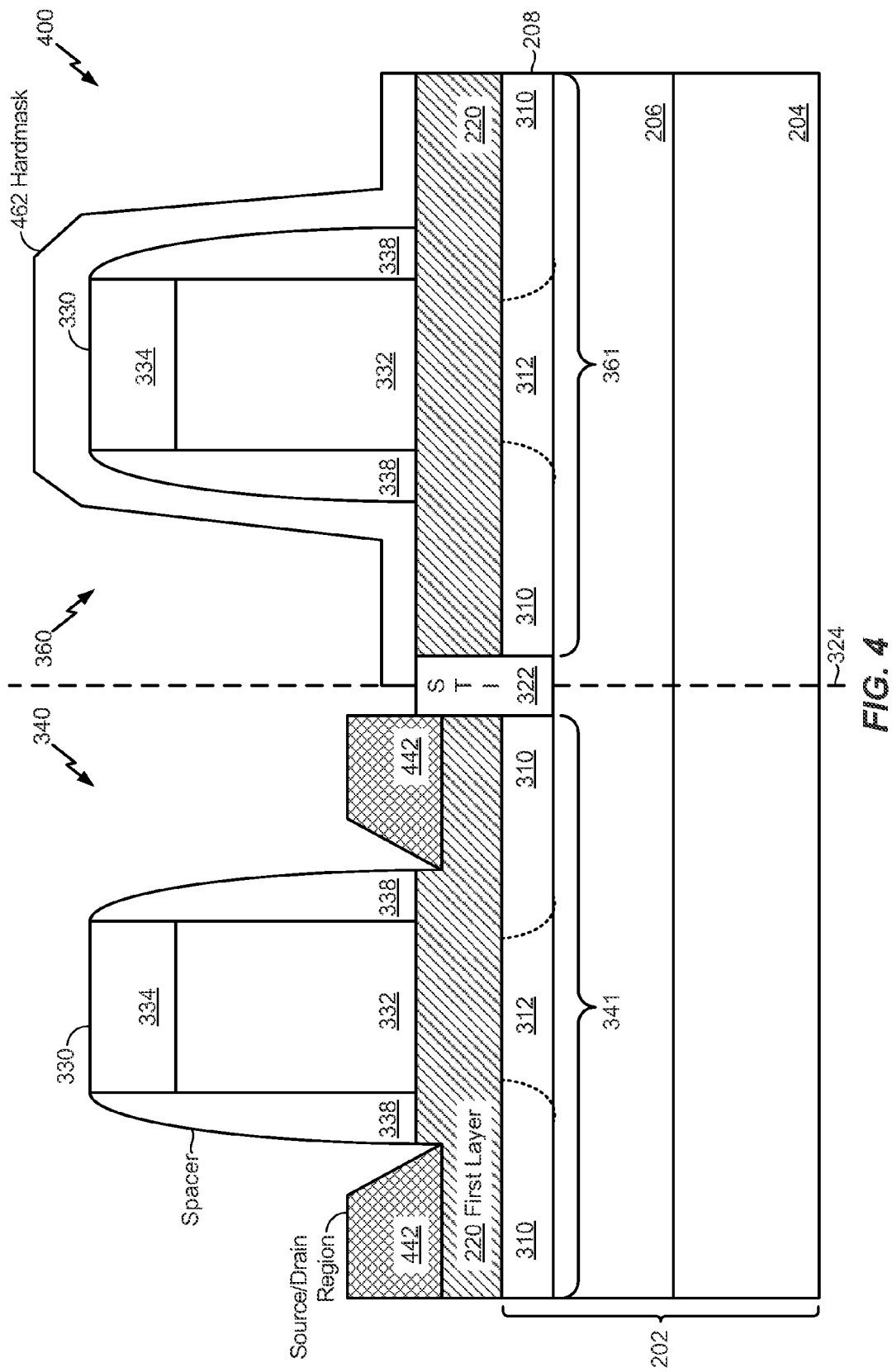
FIG. 4 is a fourth illustrative diagram of at least one stage in the process of fabricating a complementary metal-oxide-semiconductor (CMOS) device after forming a source/drain region above a first portion of an extension layer and after depositing a hardmask above a second portion of the extension layer.

Referring to FIG. 4, a fourth illustrative diagram of at least one stage in the process of fabricating a complementary metal-oxide-semiconductor (CMOS) device is depicted and generally designated 400. A hardmask 462 may be deposited above the second portion 361 of the extension layer 208. In a particular embodiment, the hardmask 462 is deposited on the second gate stack 330 of the second area 360 and on an exposed portion of the first layer 220 of the second area 360.

Source/drain regions 442 may be formed above the first portion 341 of the extension layer 208. In a particular embodiment, the source/drain regions 442 are epitaxially deposited (e.g., epitaxially grown) on an exposed portion of the first layer 220 of the first area 340. The source/drain regions 442 may be raised above the first layer 220 of the first area 340. In another particular embodiment, the source/drain regions 442 are epitaxially deposited using in-situ doping. Each of the source/drain regions 442 may be formed at least partially in a trench of the first layer 220. The trench of the first layer 220 may be a result of erosion of the first layer 220 that occurred during formation (e.g., an etch process) of the spacers 338.

The source/drain regions 442 may include embedded-silicon germanium (e-SiGe). In a particular embodiment, the first layer 220 includes silicon germanium (SiGe) having a first concentration of germanium (Ge) and the source/drain regions 442 include embedded-silicon germanium (e-SiGe) having a second concentration of germanium (Ge). The first concentration of germanium (Ge) may include a lower concentration of germanium (Ge) than the second concentration of germanium (Ge).

Figure 5:
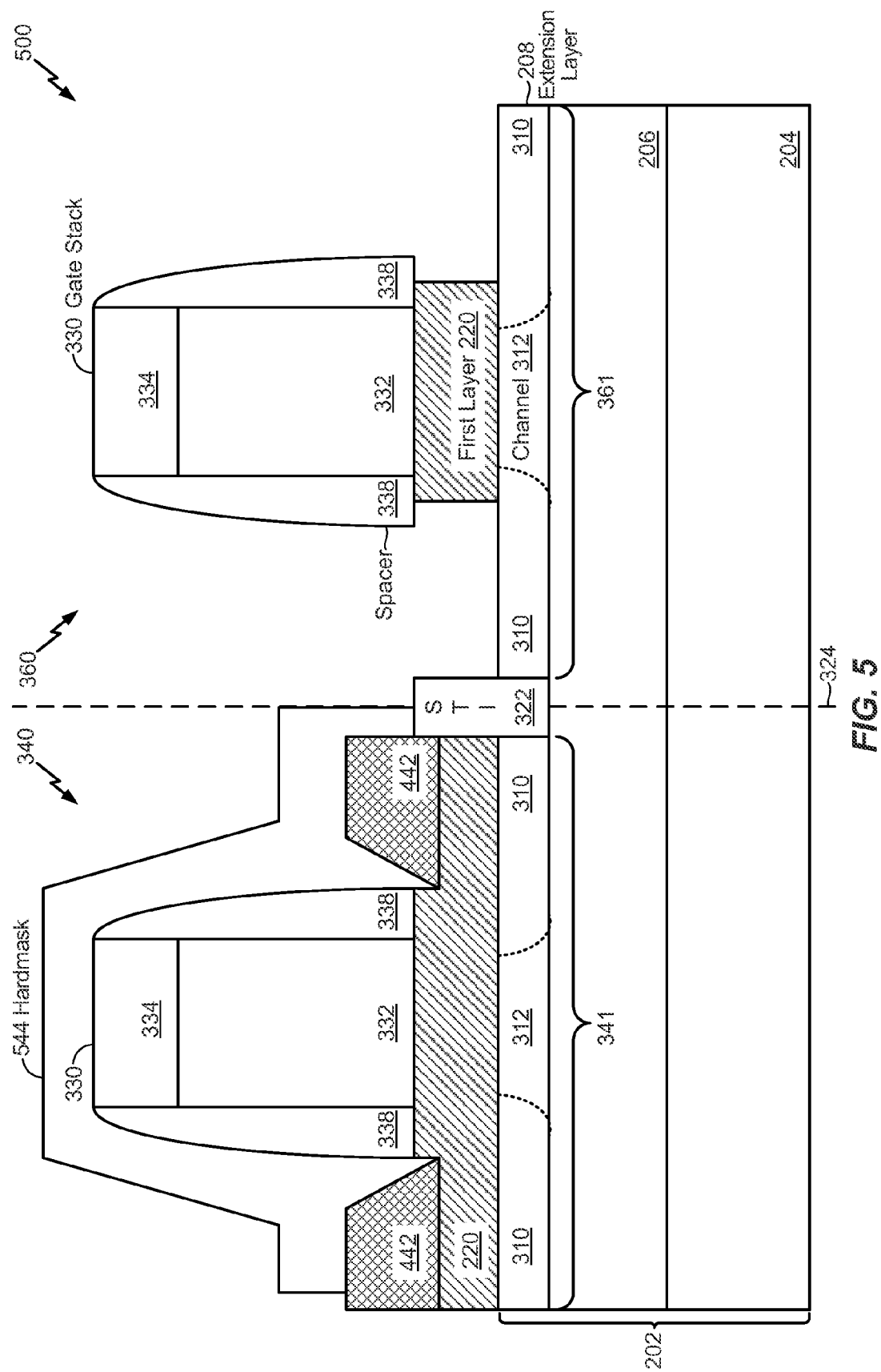
FIG. 5 is a fifth illustrative diagram of at least one stage in the process of fabricating a complementary metal-oxide-semiconductor (CMOS) device after forming a hardmask above a first portion of an extension layer and after removing a portion of a first layer from above a second portion of the extension layer.

Referring to FIG. 5, a fifth illustrative diagram of at least one stage in the process of fabricating a complementary metal-oxide-semiconductor (CMOS) device is depicted and generally designated 500. The hardmask 462 of FIG. 4 may be removed from the second area 360 and a hardmask 544 may be deposited above the first portion 341 of the extension layer 208. In a particular embodiment, the hardmask 544 is deposited on the first gate stack 330 of the first area 340 and on the source/drain regions 442.

A portion of the first layer 220 may be selectively removed above the second portion 361 of the extension layer 208. In a particular embodiment, an additional portion of the first layer 220 is selectively recessed so as to undercut the first layer 220 below the spacers 338 of the second area 360.

Figure 6:
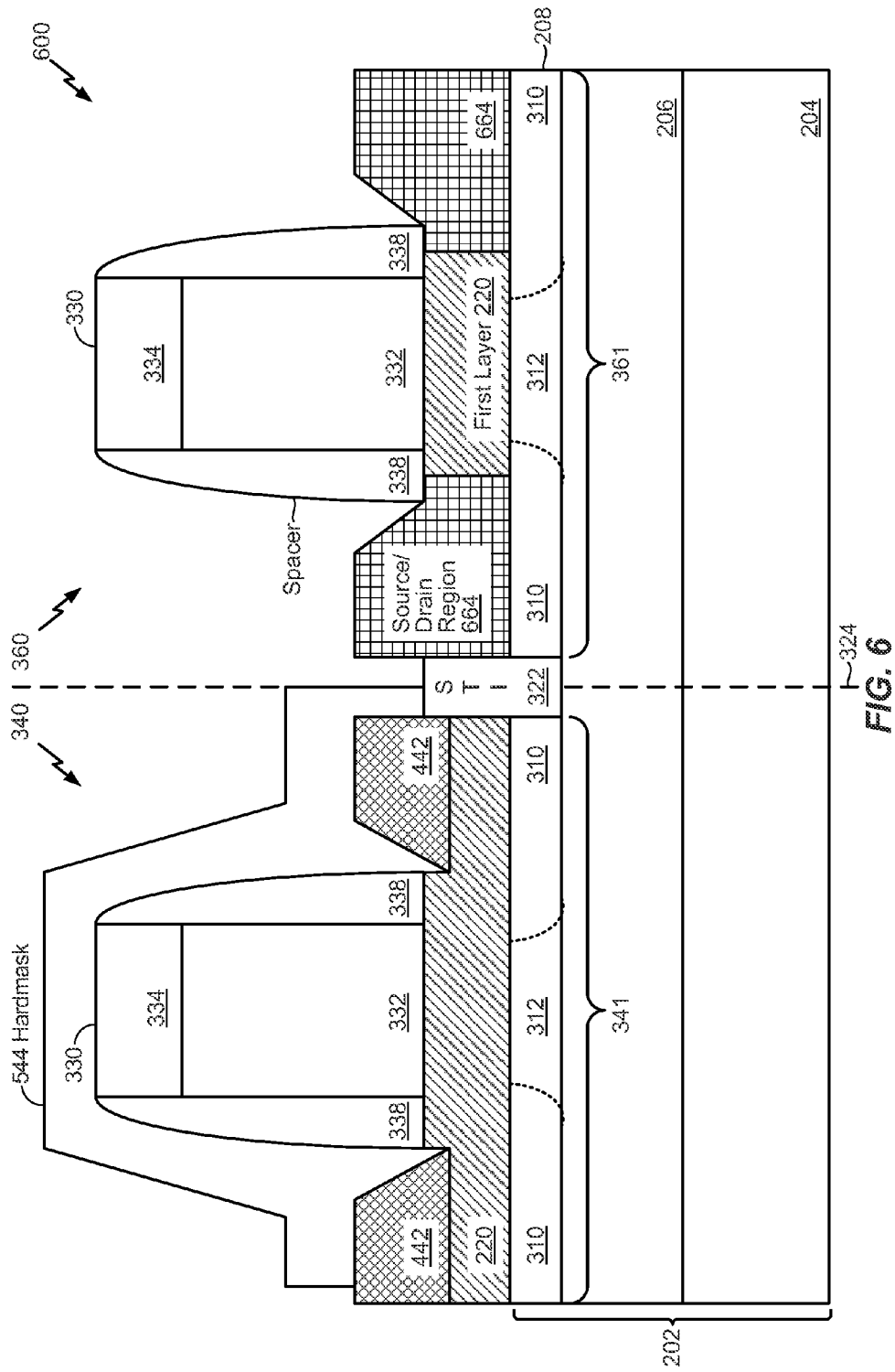
FIG. 6 is a sixth illustrative diagram of at least one stage in the process of fabricating a complementary metal-oxide-semiconductor (CMOS) device after forming a source/drain region above a second portion of an extension layer.

Referring to FIG. 6, a sixth illustrative diagram of at least one stage in the process of fabricating a complementary metal-oxide-semiconductor (CMOS) device is depicted and generally designated 600. Source/drain regions 664 may be formed above the second portion 361 of the extension layer 208. In a particular embodiment, source/drain regions 664 are epitaxially deposited on an exposed portion of the extension layer 208 of the second area 360. The source/drain regions 664 may be raised above the extension layer 208 of the second area 360. In another particular embodiment, the source/drain regions 664 are epitaxially deposited using in-situ doping.

The source/drain regions 664 may include silicon (Si), silicon carbon (Si:C), or another material that increases channel mobility in an n metal-oxide-semiconductor (nMOS) device (e.g., an n-type metal-oxide-semiconductor field effect transistor (nMOSFET)). In a particular embodiment, the source/drain regions 664 include embedded silicon (e-Si) or embedded silicon carbon (e-Si:C).

Figure 7:
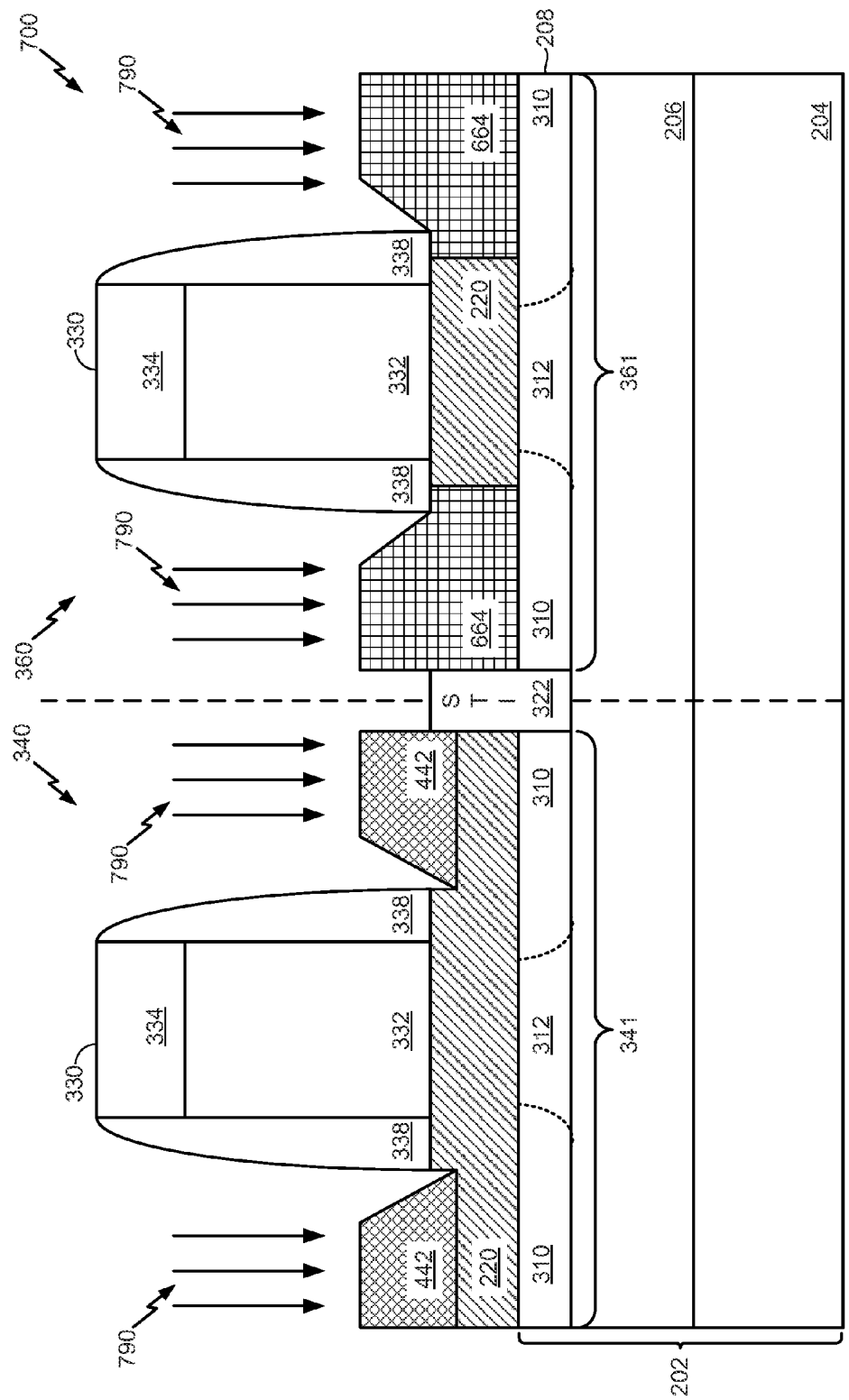
FIG. 7 is a seventh illustrative diagram of at least one stage in the process of fabricating a complementary metal-oxide-semiconductor (CMOS) device after removing a hardmask from above a first portion of an extension layer and during application of doping implants to source/drain regions of the CMOS device.

Referring to FIG. 7, a seventh illustrative diagram of at least one stage in the process of fabricating a complementary metal-oxide-semiconductor (CMOS) device is depicted and generally designated 700. The hardmask 544 of FIGS. 5 and 6 may be removed from the first area 340. If the source/drain regions 442 were not deposited with in-situ doping, doping implants 790 may be applied to the source/drain regions 442. Likewise, if the source/drain regions 664 were not deposited with in-situ doping, doping implants 790 may be applied to the source/drain regions 644. The doping implants 790 of the first area 340 may be different doping implants than the doping implants 790 of the second area 360. Rapid thermal annealing (RTA), laser scribe annealing (LSA), or a combination thereof may be performed to diffuse source-drain dopants and to densify the spacers 338.

Figure 8:
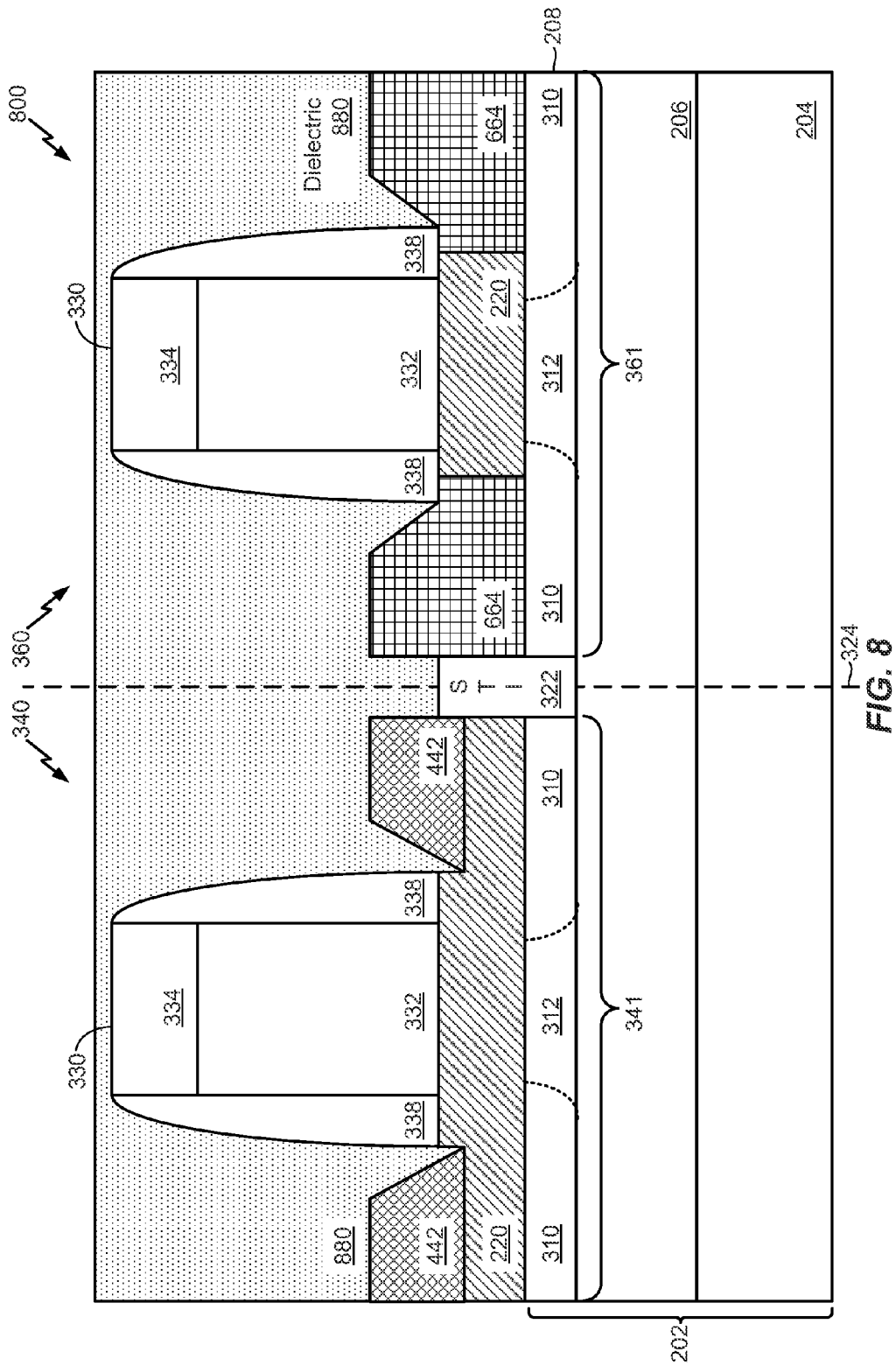
FIG. 8 is an eighth illustrative diagram of at least one stage in the process of fabricating a complementary metal-oxide-semiconductor (CMOS) device after a dielectric material is deposited above a wafer.

Referring to FIG. 8, an eighth illustrative diagram of at least one stage in the process of fabricating a complementary metal-oxide-semiconductor (CMOS) device is depicted and generally designated 800. A dielectric layer 880 may be deposited above the wafer 202. For example, the dielectric layer 880 may be the dielectric 180 of FIG. 1. The dielectric layer 880 may include a silicon-containing material.

Figure 9:
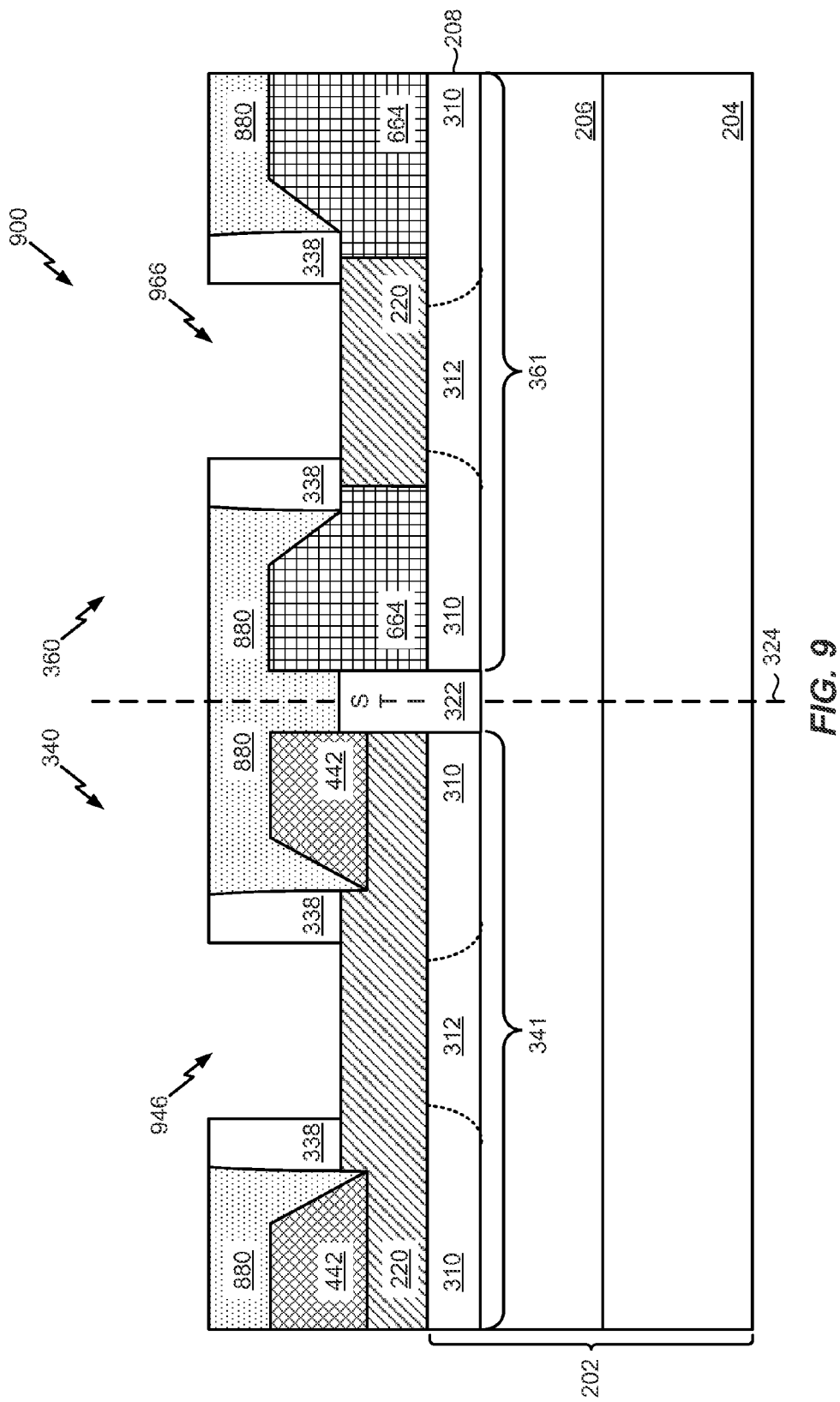
FIG. 9 is a ninth illustrative diagram of at least one stage in the process of fabricating a complementary metal-oxide-semiconductor (CMOS) device after planarization is performed and after a portion of each gate stack is removed.

Referring to FIG. 9, a ninth illustrative diagram of at least one stage in the process of fabricating a complementary metal-oxide-semiconductor (CMOS) device is depicted and generally designated 900. A chemical mechanical planarization (CMP) (e.g., a chemical mechanical polish) may be performed to remove a portion of the dielectric layer 880 of FIG. 8, a portion of the gate stacks 330 of FIGS. 3-8, and a portion of the spacers 338 of FIGS. 3-8. In a particular embodiment, the CMP polish removes the capping layers 334 of FIGS. 3-8 and a portion of the gate electrode layer 332 of FIGS. 3-8. The gate electrode layer 332 may be removed from each of the gate stacks 330 to establish a cavity 946 associated with the first area 340 and a cavity 966 associated with the second area 360. For example, the gate electrode layer 332 may be etched out of each of the gate stacks 330. In a particular embodiment, the gate electrode layer 332 includes amorphous silicon (a-Si) which is removed from each gate stack 330. In another particular embodiment, the cavity 946 exposes the first layer 220 above the first portion 341 of the extension layer 208, and the cavity 966 exposes the first layer 220 above the second portion 361 of the extension layer 208.

Figure 10:
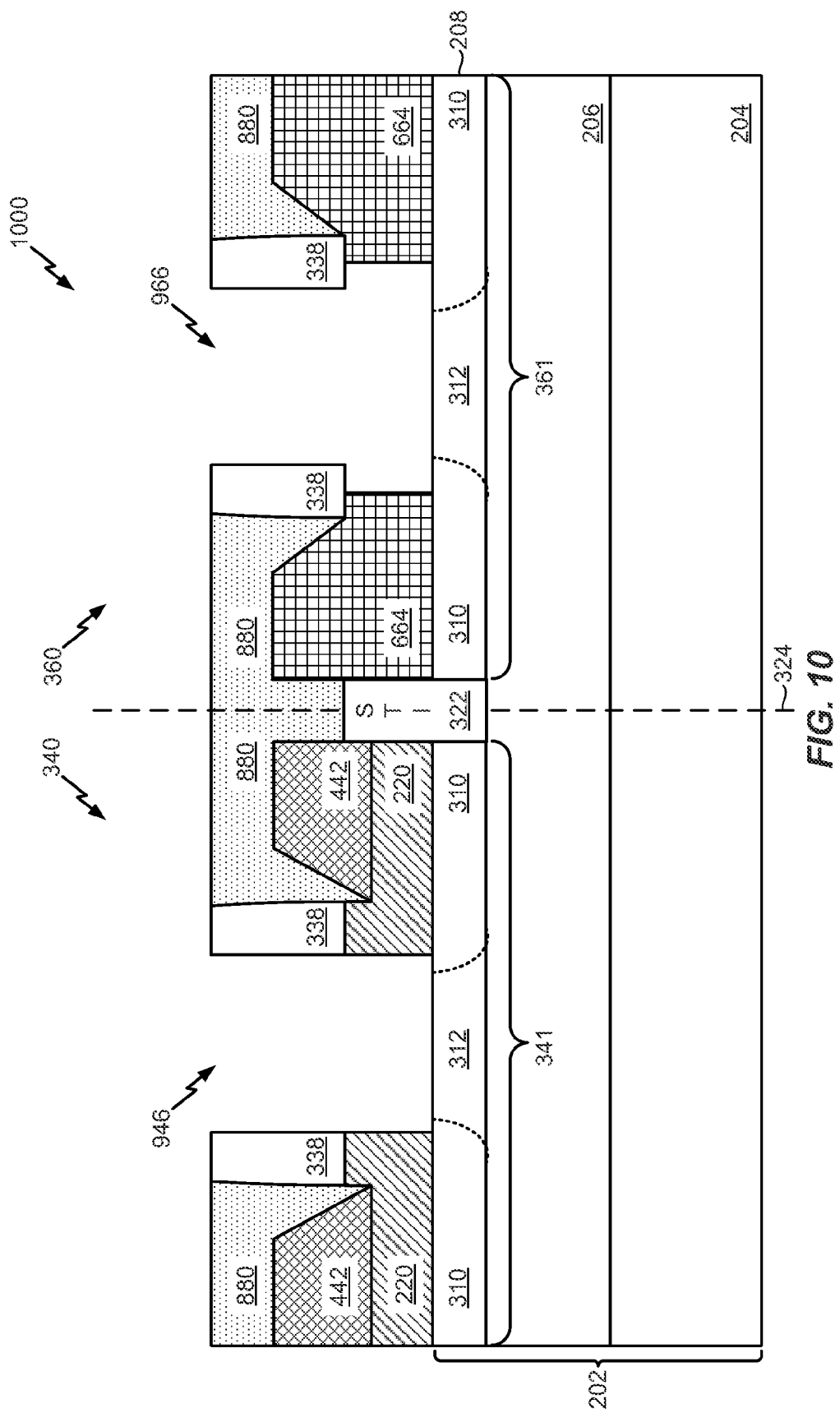
FIG. 10 is a tenth illustrative diagram of at least one stage in the process of fabricating a complementary metal-oxide-semiconductor (CMOS) device after a first layer is selectively removed to extend a cavity to an extension layer.

Referring to FIG. 10, a tenth illustrative diagram of at least one stage in the process of fabricating a complementary metal-oxide-semiconductor (CMOS) device is depicted and generally designated 1000. The first layer 220 may be selectively removed above the first portion 341 and above the second portion 361 of the extension layer 208. For example, the first layer 220 may be selectively etched above the first portion 341 and above the second portion 361. In a particular embodiment, the first layer 220 is completely removed from above the second portion 361 of the extension layer 208. For example, the first layer 220 may include silicon germanium (SiGe) and the first layer 220 including the silicon germanium (SiGe) may be completely removed from above the second portion 361 of the extension layer 208. When the second area 360 is associated with an nMOS device, the complete removal of the first layer 220 including silicon germanium (SiGe) may be advantageous because silicon germanium (SiGe) creates a residual strain in a channel of the nMOS device that may adversely impact a performance characteristic of the nMOS device.

As depicted in FIG. 10, the complete removal of the first layer 220 from above the second portion 361 of the extension layer 208 may create an undercut under the spacers 338 associated with the second area 360. One of skill in the art will appreciate that a removal of a portion of the first layer 220 above the first portion 341 of the extension layer 208 may create an undercut under the spacers 338 associated with the first area 340.

In a particular embodiment, the cavity 946 of FIG. 9 is extended to expose the channel region 312 of the first portion 341 of the extension layer 208 and the cavity 966 is extended to expose the channel region 312 of the second portion 361 of the extension layer 208. Extending the cavity 946 and the cavity 966 may establish an extension structure on either side of the cavities 946 and 966. For example, a first extension structure including the first layer 220 and the source/drain regions 442 may be established on either side of the cavity 946 and a second extension structure including the source/drain regions 664 may be established on either side of the cavity 966.

Figure 11:
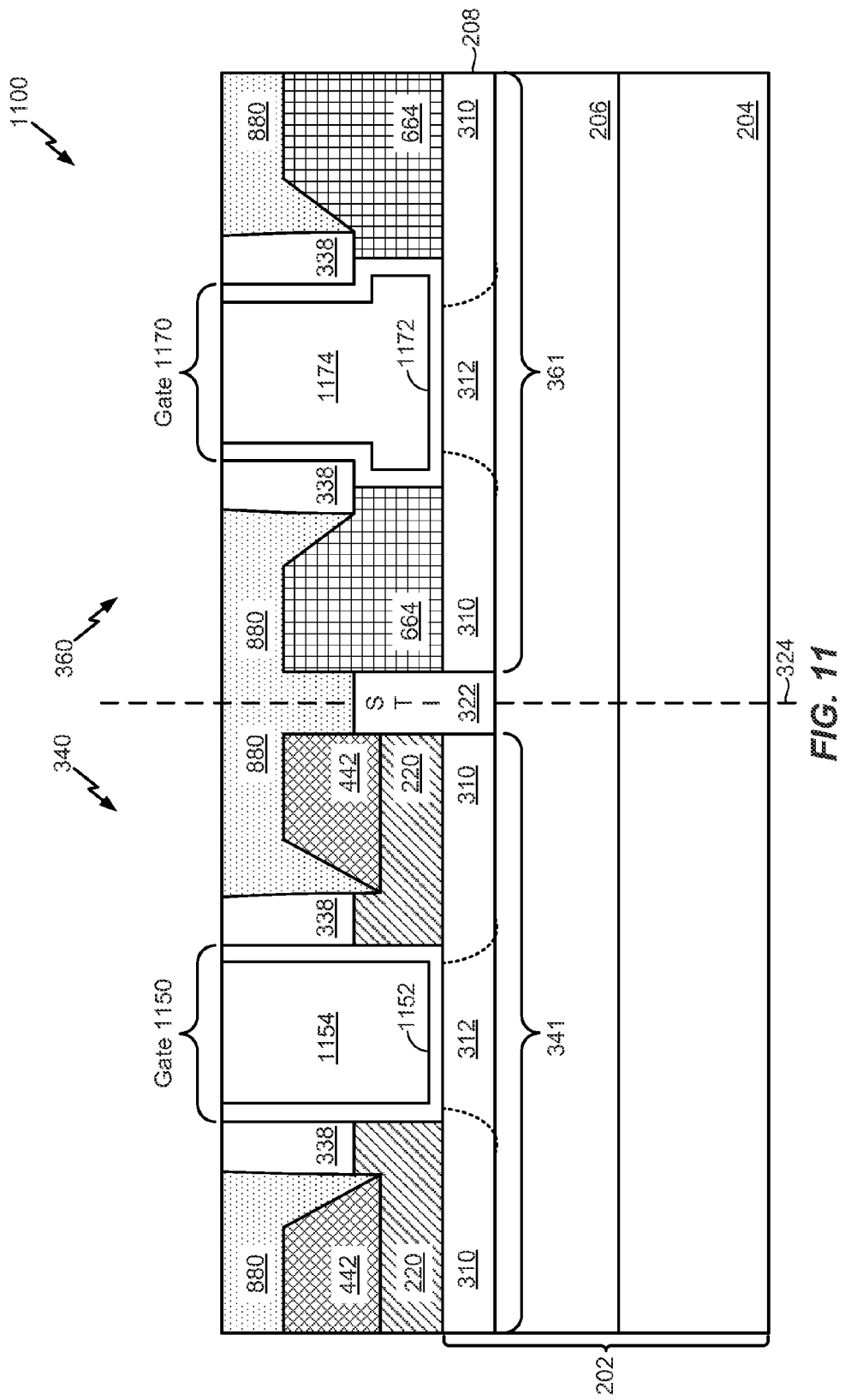
FIG. 11 is an eleventh illustrative diagram of at least one stage in the process of fabricating a complementary metal-oxide-semiconductor (CMOS) device after forming one or more gates above an extension layer.

Referring to FIG. 11, an eleventh illustrative diagram of at least one stage in the process of fabricating a complementary metal-oxide-semiconductor (CMOS) device is depicted and generally designated 1100. A gate 1150 may be formed in the cavity 946 of FIG. 10 and another gate 1170 may be formed in the cavity 966 of FIG. 10. The gate 1150 and the gate 1170, respectively, may each include a gate oxide layer 1152 and 1172 and a metal gate layer 1154 and 1174. In a particular embodiment, the gate oxide layers 1152 and 1172 are formed using atomic layer deposition (ALD). For example, the gate oxide layers 1152 and 1172 may each include a conformal gate oxide layer having a substantially uniform thickness. The gate oxide layers 1152 and 1172 may include a high-k gate dielectric. The metal gate layers 1154 and 1174 may include a metal material. For example, the metal gate layers 1154 and 1174 may include titanium nitride, tantalum nitride, or aluminum nitride, as illustrative examples.

In a particular embodiment, the gate 1150 is in contact with a channel of the channel region 312 of the first portion of the extension layer 208 and in contact with the first extension structure that includes the first layer 220 and the source/drain regions 442. In a particular embodiment, the gate 1170 is in contact with a channel of the channel region 312 of the second portion of the extension layer 208 and in contact with the second extension structure that includes the source/drain regions 644.

Figure 12:
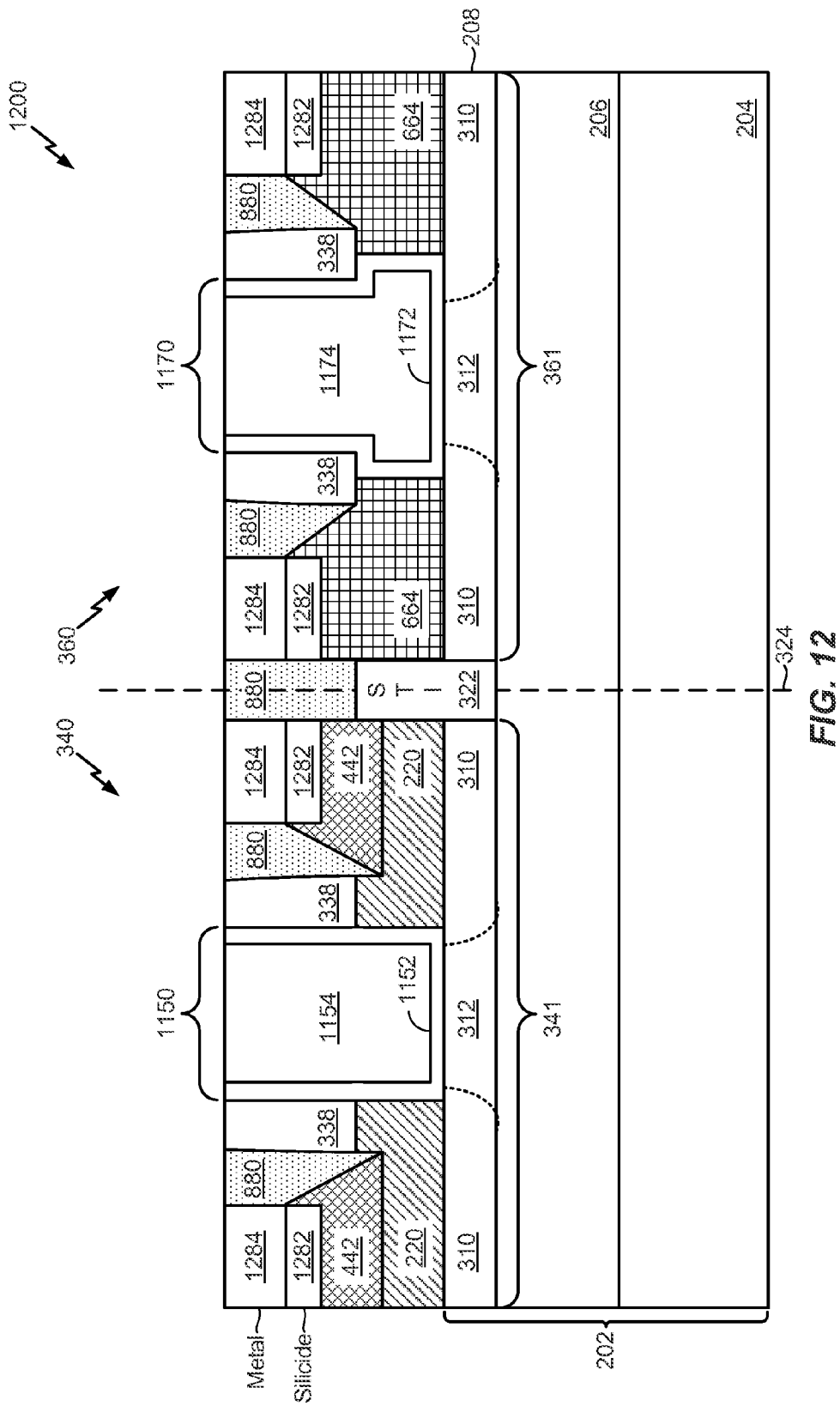
FIG. 12 is a twelfth illustrative diagram of at least one stage in the process of fabricating a complementary metal-oxide-semiconductor (CMOS) device after forming silicides and connecting a metal to each silicide.

Referring to FIG. 12, a twelfth illustrative diagram of at least one stage in the process of fabricating a complementary metal-oxide-semiconductor (CMOS) device is depicted and generally designated 1200. Trenches may be formed in each of the source/drain regions 442 and 664. For example, the trenches may be silicide trenches into which silicide 1282 is formed. The silicide 1282 may include one of nickel silicide (NiSi) and/or platinum silicide (PtSi). As another example, the silicide 1282 may be partially formed in the trenches. In a particular embodiment, the silicide 1282 is not formed in trenches and instead is formed above an upper surface of each of the source/drain regions 442 and 644. A metal 1284 may be connected to each deposit of the silicide 1282. The metal 1284 may be operative to act as one of a source electrode or a drain electrode. In a particular embodiment, the metal 1284 includes tungsten (W).

A complementary metal-oxide semiconductor (CMOS) device includes the wafer 202 having the extension layer 208, a first transistor in the first area 340, and a second transistor in the second area 360. The first transistor includes the first gate 1150 on the extension layer 208 and the first extension structure (e.g., the first layer 220 and/or the source/drain regions 442) in contact with the first gate 1150. The second transistor includes the second gate 1170 on the extension layer 208 and the second extension structure (e.g., the source/drain regions 664) in contact with the second gate 1170. The second extension structure (e.g., the source/drain regions 664) may be complementary to the first extension structure (e.g., the first layer 220 and/or the source/drain regions 442). In a particular embodiment, the first transistor is a p-type transistor and the second transistor is an n-type transistor. The spacer 338 of the second transistor may be a spacer 338 of the second area 360 and may include a bottom surface in contact with the second extension structure (e.g., the source/drain regions 664) and the second gate 1170. Additionally, a particular spacer 338 may be attached to the gate 1150 of the first transistor and positioned at least partially between the gate 1150 and a particular source/drain region 442.

Figure 13:
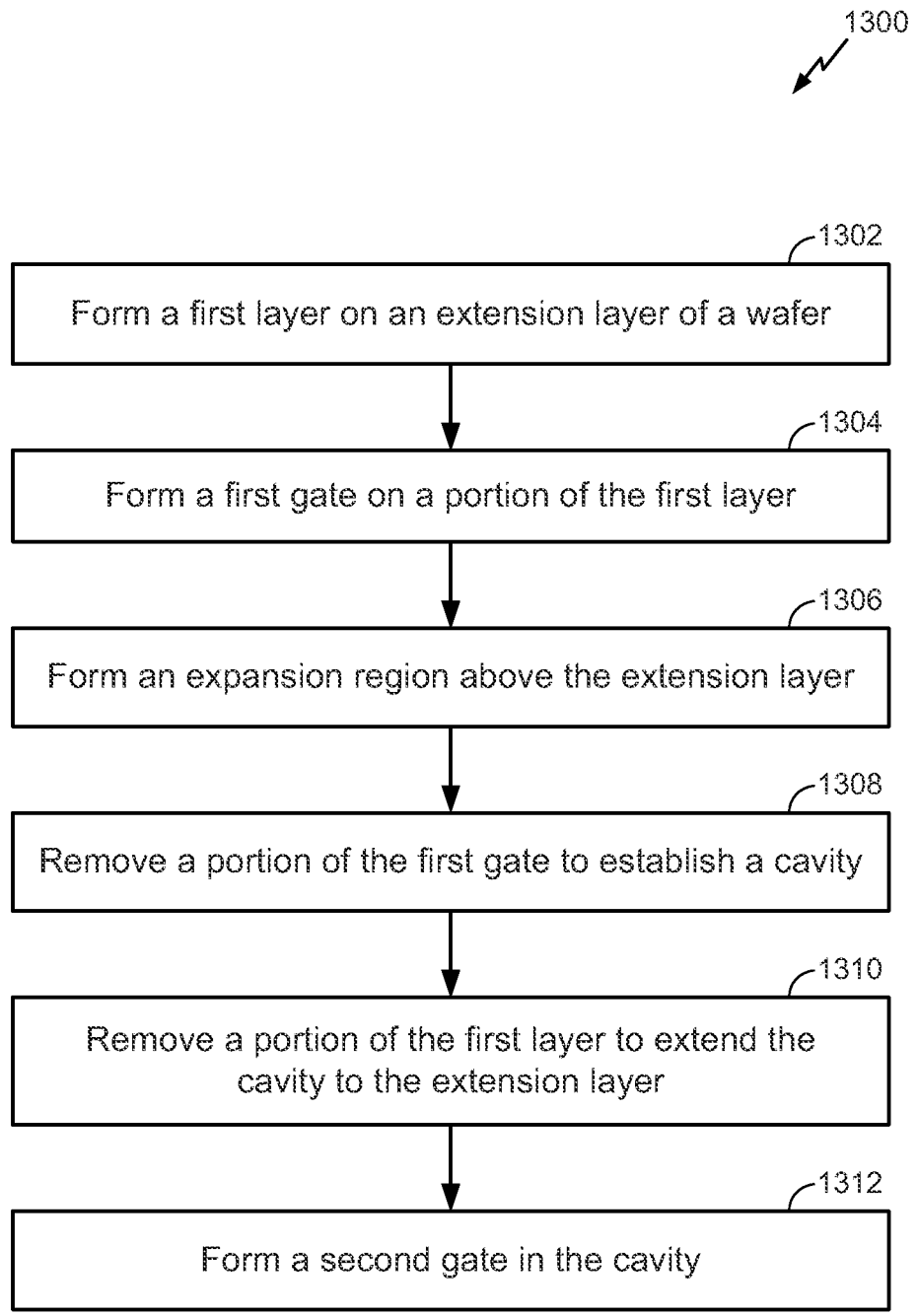
FIG. 13 is a flow diagram of a first illustrative embodiment of a method of forming a complementary metal-oxide-semiconductor (CMOS) device.

FIG. 13 is a flow diagram of a first illustrative embodiment 1300 of a method of forming a complementary metal-oxide-semiconductor (CMOS) device. For example, the CMOS device may include the CMOS device 100 of FIG. 1 or the CMOS device including the first area 340 and the second area 360 as shown in FIG. 12. A first layer is formed on an extension layer of a wafer, at 1302. For example, the first layer formed on the extension layer of the wafer may be the expansion region 120 formed on the extension layer 108 of the wafer 102 of FIG. 1 or the first layer 220 formed on the extension region 208 of the wafer 202 of FIG. 2B.

A first gate is formed on a portion of the first layer, at 1304. The first gate may include a gate stack. The extension layer of the CMOS device may include a first portion associated with a first transistor of a first type and a second portion associated with a second type. In a particular embodiment, the first type is a p-type and the second type is an n-type. The first gate may be formed on the first portion of the extension layer, the second portion of the extension layer, or a combination thereof. For example, the first gate formed on a portion of the first layer may be the gate stack 330 formed above the first portion 341 of the extension layer 308 or the first gate stack 330 formed above the second portion 361 of the extension layer 308 of FIG. 3.

An expansion region is formed above the extension layer, at 1306. For example, forming the expansion region above the extension layer may include forming the source/drain regions 442 of FIG. 4, forming the source/drain regions 664 of FIG. 6, or a combination thereof. As a further example, the expansion region may include one of the expansion regions 120 and 164 of FIG. 1.

A portion of the first gate is removed to establish a cavity, at 1308. In a particular embodiment, a gate electrode layer of the first gate is removed to establish the cavity. The portion of the first gate removed may include amorphous silicon (a-Si). For example, the gate electrode layer 332 of the gate stack 330 formed above the first portion 341 of the extension layer 208 of FIGS. 3-8 may be removed to establish the cavity 946 of FIG. 9, or the gate electrode layer 332 of the gate stack 330 formed above the second portion 361 of the extension layer 208 of FIGS. 3-8 may be removed to establish the cavity 966.

A portion of the first layer is removed to extend the cavity to the extension layer, at 1310. For example, a portion of the first layer 202 of FIG. 9 may be removed to extend the cavity 946 of FIG. 9 to the extension layer 208 as shown in FIG. 10 or to extend the cavity 966 of FIG. 9 to the extension layer 208 as shown in FIG. 10.

A second gate may be formed in the cavity, at 1312. For example, as shown in FIG. 11, the gate 1150 may be formed in the cavity 946 of FIG. 10 or the gate 1170 may be formed in the cavity 966 of FIG. 10. As a further example, the second gate may be one of the gate 150 or the gate 170 of FIG. 1.

The method of FIG. 13 may enable formation of a CMOS device that is able to be used in low-power applications. A thickness of the channel region, such as an extension layer (e.g., a silicon layer) of a wafer, may remain unchanged while a thickness of an extension region may be independently adjusted. For example, the thickness $t_c$ of the channel region 112 of the first portion 141 of the extension layer 108 may remain unchanged while a thickness $t_{exp}$ of the extension region 120 may be independently raised above the extension layer 108. Further, the formation of the CMOS device may resolve bottle-neck issues for both an nMOS transistor and a pMOS transistor of a particular CMOS device that are present in conventional CMOS devices as a result of a high resistance of an extension region (Rext).

Figure 14:
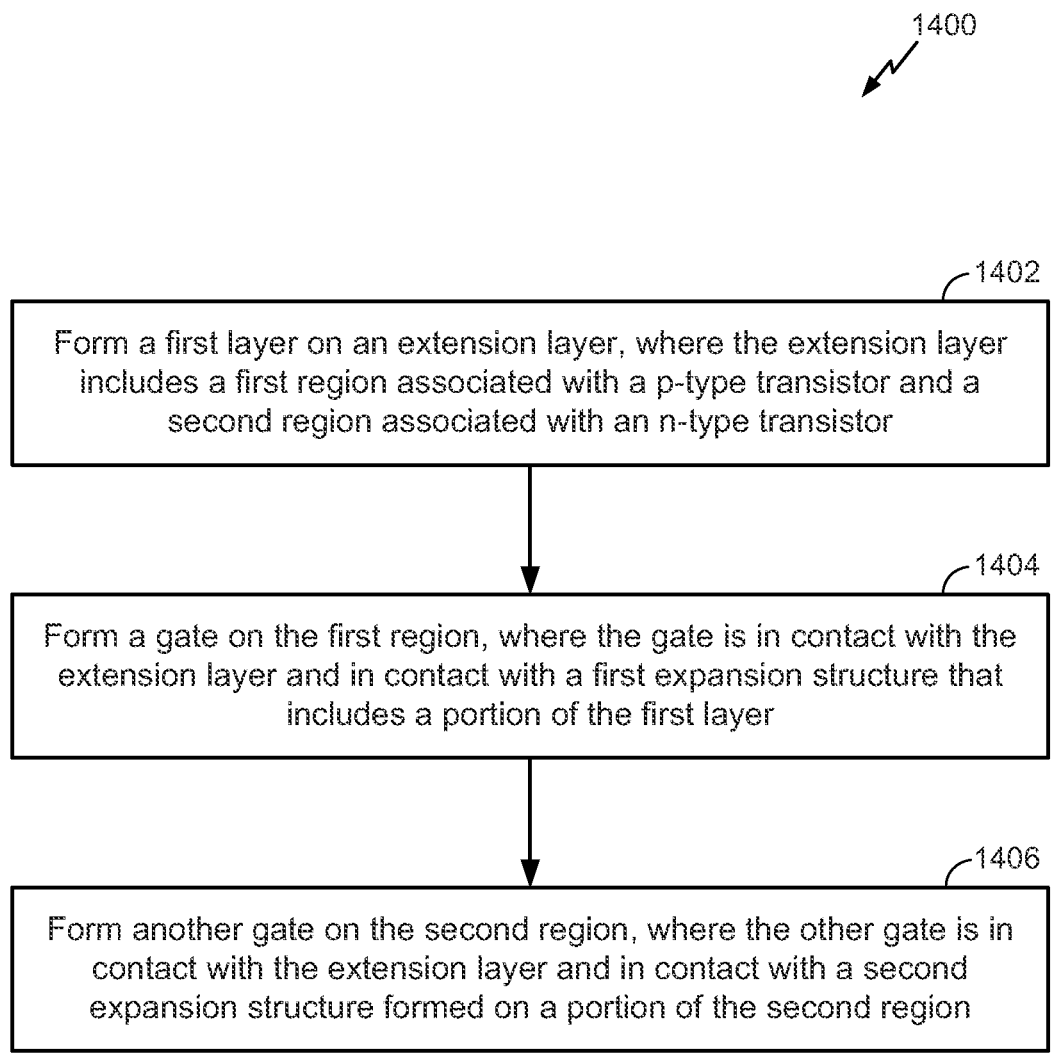
FIG. 14 is a flow diagram of a second illustrative embodiment of a method of forming a complementary metal-oxide-semiconductor (CMOS) device.

FIG. 14 is a flow diagram of a second illustrative embodiment 1400 of a method of forming a complementary metal-oxide-semiconductor (CMOS) device. In the second illustrative embodiment 1400, the method includes forming a first layer on an extension layer, where the extension layer includes a first region associated with a p-type transistor and a second region associated with an n-type transistor, at 1402. For example, the first layer 220 may be formed on the extension layer 208 of FIG. 2. The extension layer 208 may include the first portion 341 and the second portion 361 as shown in FIGS. 3-12.

A gate is formed on the first region, where the gate is in contact with the extension layer and in contact with a first expansion structure that includes a portion of the first layer, at 1404. For example, the gate 1150 may be formed on the first portion 341 of the expansion layer 208 and may be in contact with a first expansion structure that includes a portion of the first layer 220, as shown in FIGS. 11 and 12. The first expansion structure may include the first layer 220 and the source/drain regions 442 of FIGS. 11 and 12. As a further example, the gate 150 may be in contact with the extension layer 108 and the expansion region 120 of FIG. 1.

Another gate is formed on the second region, where the other gate is in contact with the extension layer and in contact with a second expansion structure formed on a portion of the second region, at 1406. For example, the other gate 1170 may be formed on the second portion 361 of the expansion layer 208 and may be in contact with a second expansion structure, as shown in FIGS. 11 and 12. The second expansion structure may include the source/drain regions 664 of FIGS. 11 and 12. As a further example, the gate 170 may be in contact with the extension layer 108 and the expansion region 164 of FIG. 1.

The method of FIG. 14 may enable formation of a CMOS device where a thickness of an extension region may be established independent of a thickness of a channel region (e.g., a silicon layer of a wafer). The thickness of the extension region may resolve a high resistance of an extension region (Rext) that causes bottle-neck issues in conventional CMOS devices. Accordingly, the CMOS device may include characteristics that improve performance of the CMOS device as compared to the conventional CMOS devices.

Figure 15:
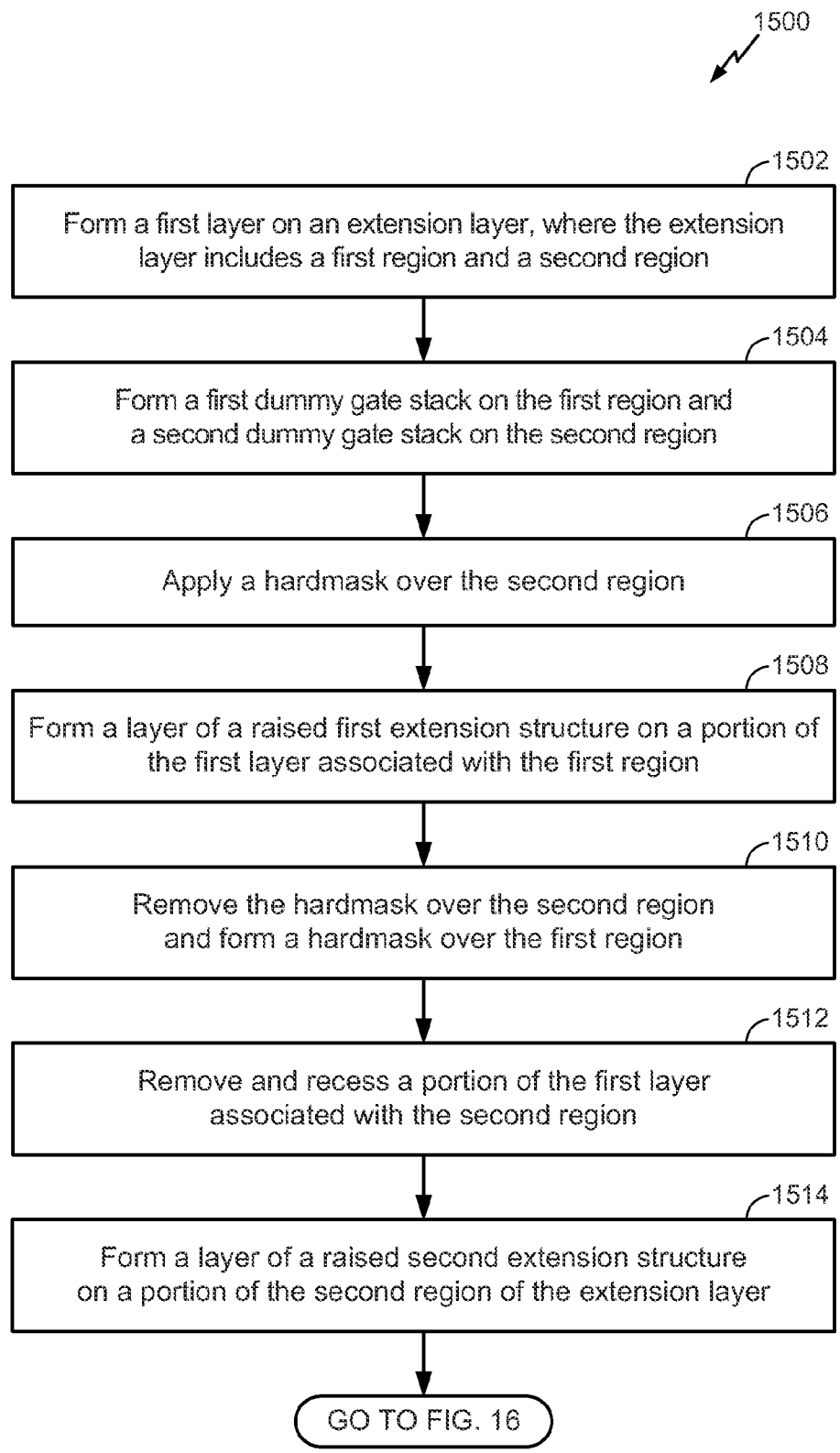
FIG. 15 is a flow diagram of a first portion of a third illustrative embodiment of a method of forming a complementary metal-oxide-semiconductor (CMOS) device.

FIG. 15 is a flow diagram of a first portion 1500 of a third illustrative embodiment of a method of forming a complementary metal-oxide-semiconductor (CMOS) device. For example, the CMOS device may include the CMOS device 100 of FIG. 1 or the CMOS device including the first area 340 and the second area 360 as shown in FIG. 12. In the first portion 1500 of the third illustrative embodiment, the method includes forming a first layer on an extension layer, where the extension layer may include a first region and a second region, at 1502. For example, the first layer formed on the extension layer of the wafer may be a portion of the expansion region 120 formed on the extension layer 108 of the wafer 102 of FIG. 1 or the first layer 220 formed on the extension region 208 of the wafer 202 of FIG. 2B. The extension layer 108 may include the first portion 141 and the second portion 161, as shown in FIG. 1, and the extension layer 208 may include the first portion 341 and the second portion 361, as shown in FIGS. 3-12.

A first dummy gate stack may be formed on the first region and a second dummy gate stack may be formed on the second region, at 1504. For example, the first dummy gate stack and/or the second dummy gate stack may be the gate stack 330 formed above the first portion 341 of the extension layer 308 or the first gate stack 330 formed above the second portion 361 of the extension layer 308 of FIG. 3.

A hardmask may be applied over the second region, at 1506, and a layer of a raised first extension structure may be formed on a portion of the first layer associated with the first region, at 1508. For example, the hardmask 462 of FIG. 4 may be formed on the first region 361 of the extension layer 308 and on the gate stack 330 formed on the second portion 361. Further, the source/drain regions 442 may be formed on a portion of the first layer 220 as shown in FIG. 4. As a further example, the first extension structure may include the expansion region 120 of FIG. 1 or may include a portion of the first layer 220 and the source/drain regions 442 as shown in FIGS. 10-12.

In a particular embodiment, the first extension structure includes a first extension structure region formed on the extension layer and a second extension structure region. For example, the first extension structure may include a portion of the first layer 220 formed on the extension layer 208 and the source/drain regions 442, as shown in FIGS. 10-12. In another example, the first extension structure may include a portion of the first layer 220 formed on the extension layer 208 and the source/drain regions 442 formed at least partially in a trench of the first layer 220, as shown in FIGS. 10-12. In another particular embodiment, the first extension structure includes silicon germanium (SiGe) or another material that increases p-type metal-oxide semiconductor (pMOS) channel mobility. For example, when the first extension structure includes a portion of the first layer 220 formed on the extension layer 208 and the source/drain regions 442, the first layer may include a first concentration of germanium (Ge) and the source/drain regions 442 may include a second concentration of germanium (Ge). In a particular embodiment, the first concentration of germanium (Ge) is lower than the second concentration of germanium (Ge).

The hardmask may be removed over the second region and a hardmask may be formed over the first region, at 1510. A portion of the first layer associated with the second region may be removed and recessed, at 1512. For example, the hardmask 462 of FIG. 4 may be removed from the second area 360 and a hardmask 544 may be deposited above the first portion 341 of the extension layer 208. In a particular embodiment, the hardmask 544 is deposited on the first gate stack 330 of the first area 340 and on the source/drain regions 442. As a further example, a portion of the first layer 220 may be selectively removed and recessed above the second portion 361 of the extension layer 208, as shown in FIG. 5.

A layer of a raised second extension structure may be formed on a portion of the second region of the extension layer, at 1514. For example, a raised second extension structure may include the source/drain regions 664 and may be formed above the second portion 361 of the extension layer 208, as shown in FIGS. 6-12. In a particular embodiment, the second extension structure includes silicon (Si), silicon carbon (Si:C), or another material that increases an n-type metal-oxide-semiconductor (nMOS) channel mobility.

Figure 16:
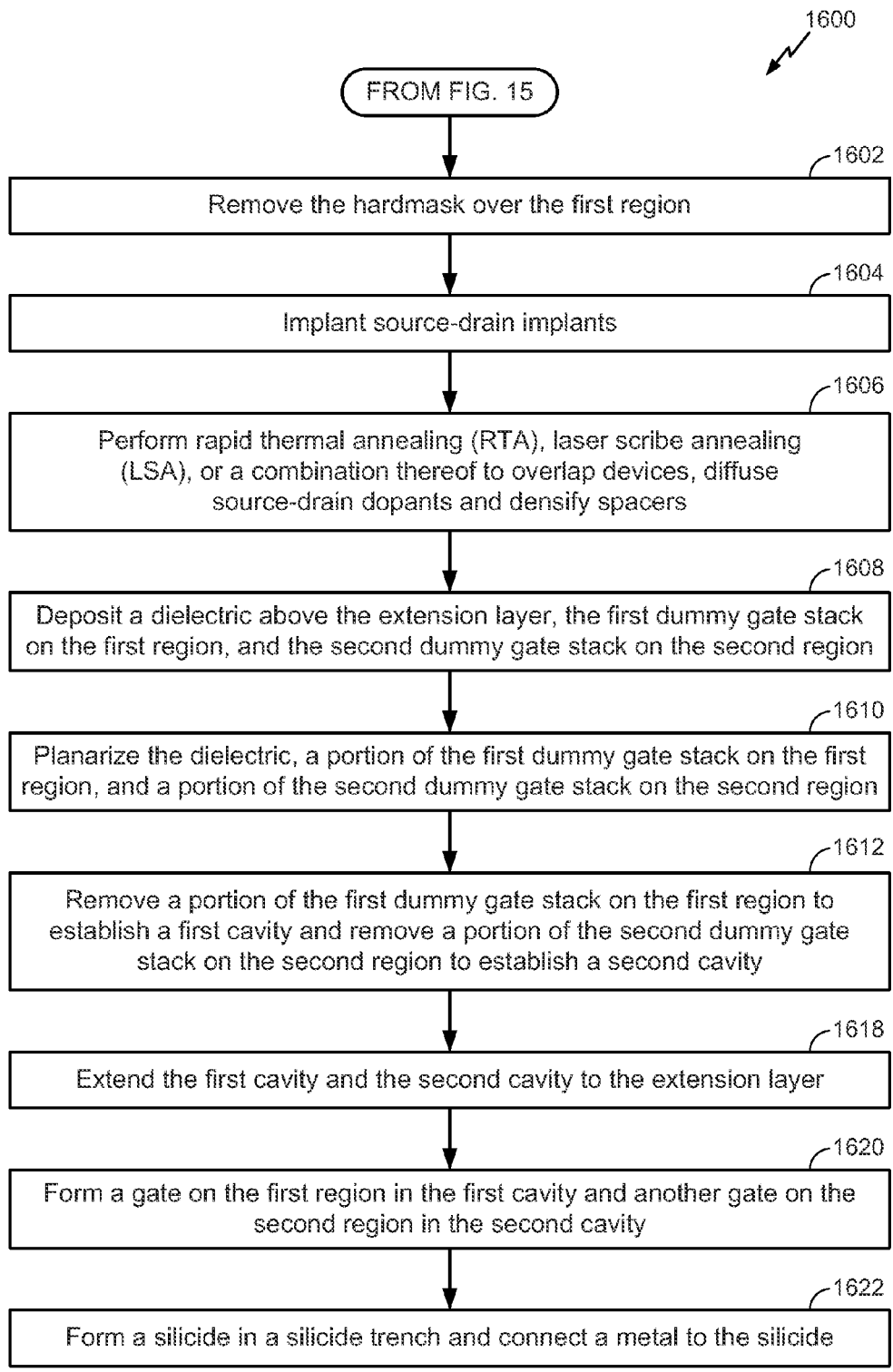
FIG. 16 is a flow diagram of a second portion of the method of FIG. 15.

FIG. 16 is a flow diagram of a second portion 1600 of the third illustrative embodiment of the method of FIG. 15. In the second portion 1600 of the third illustrative embodiment, the hardmask over the first region may be removed, at 1602, and source-drain implants may be implanted, at 1604. For example, the hardmask 544 of FIGS. 5 and 6 may be removed from above the first portion 341 of the extension layer 208. In a particular embodiment, implanting source-drain implants is optionally performed. For example, if the source/drain regions 442 and 644 were not deposited with in-situ doping, doping implants 790 may be applied to one or more of the source/drain regions 442 and 644.

Rapid thermal annealing (RTA), laser scribe annealing (LSA), or a combination thereof may be performed to overlap devices, diffuse source-drain dopants and densify spacers, at 1606. For example, RTA, LSA, or a combination thereof may also be performed to diffuse source-drain dopants of the source/drain regions 442 and 644 and to densify the spacers 338 of FIG. 7.

A dielectric may be deposited above the extension layer, the first dummy gate stack on the first region, and the second dummy gate stack on the second region, at 1608, and the dielectric, a portion of the first dummy gate stack on the first region, and a portion of the second dummy gate stack on the second region may be planarized, at 1610. For example, the dielectric layer 800 may be deposited above the gate stack 330 of the first area 340, the first layer 220, and the source/drain regions 442 and 644 as shown in FIG. 8. In particular embodiment, the dielectric is formed as a layer above the gate stack 330 of the first area 340 and above the gate stack 330 of the second area 360.

A portion of the first dummy gate stack on the first region may be removed to establish a first cavity and a portion of the second dummy gate stack on the second region may be removed to establish a second cavity, at 1612. In a particular embodiment, a first gate electrode layer of the first dummy gate stack includes amorphous silicon (a:Si) which is removed to establish the first cavity and a second gate electrode layer of the second dummy gate stack includes the amorphous silicon (a:Si) which is removed to establish the second cavity. For example, the gate electrode layer 332 may also be removed from each of the gate stacks 330 to establish the cavity 946 of FIG. 9 associated with the first area 340 and the cavity 966 of FIG. 9 associated with the second area 360. In a particular embodiment, amorphous silicon (a-Si) is removed from the gate stacks 330 to establish the cavity 946 associated with the first area 340 and the cavity 966 associated with the second area 360. In another particular embodiment, a capping layer 334 of the gate stacks 330 of FIGS. 3-8 is removed prior to or in conjunction with removing the gate electrode layer 332 from each of the gate stacks 330 to establish the cavity 946 and the cavity 966.

The first cavity and the second cavity may be extended to the extension layer, at 1618. For example, the cavity 946 and the cavity 966 of FIG. 9 may each be extended to the extension layer 208 as shown in FIG. 10. In a particular embodiment, a portion of the first layer 202 of FIG. 9 is removed to extend the cavity 946 of FIG. 9 to the extension layer 208 as shown in FIG. 10 or to extend the cavity 966 of FIG. 9 to the extension layer 208 as shown in FIG. 10.

A gate may be formed on the first region in the first cavity and another gate may be formed on the second region in the second cavity, at 1620. For example, as shown in FIG. 11, the gate 1150 may be formed in the cavity 946 of FIG. 10 or the gate 1170 may be formed in the cavity 966 of FIG. 10. As a further example, the gate and the other gate may be the gate 150 and the gate 170 of FIG. 1.

A silicide may be formed in a silicide trench and connected to a metal, at 1622. For example, trenches may be formed in each of the source/drain regions 442 and 664 and a silicide may be formed in each of the trenches as shown in FIG. 12. As another example, the silicide and the metal may be included in the source/drain electrodes 186 of FIG. 1.

The method illustrated by FIGS. 15 and 16 may enable formation of a CMOS device that is able to be used in low power applications. A thickness of the channel region, such as an extension layer (e.g., a silicon layer) of a wafer may remain unchanged while a thickness of an extension region may be independently adjusted. Further, a thickness of a channel may be maintained while a thickness of an extension region under a spacer of a gate stack may be increased to reduce bottleneck issues and improve channel control (e.g., channel mobility). The methods of FIGS. 13-16 may be implemented by a field-programmable gate array (FPGA) device, an application-specific integrated circuit (ASIC), a processing unit such as a central processing unit (CPU), a digital signal processor (DSP), a controller, another hardware device, firmware device, or any combination thereof. As an example, the methods of FIG. 13-16 can be performed by one or more processors that execute instructions.

Figure 17:
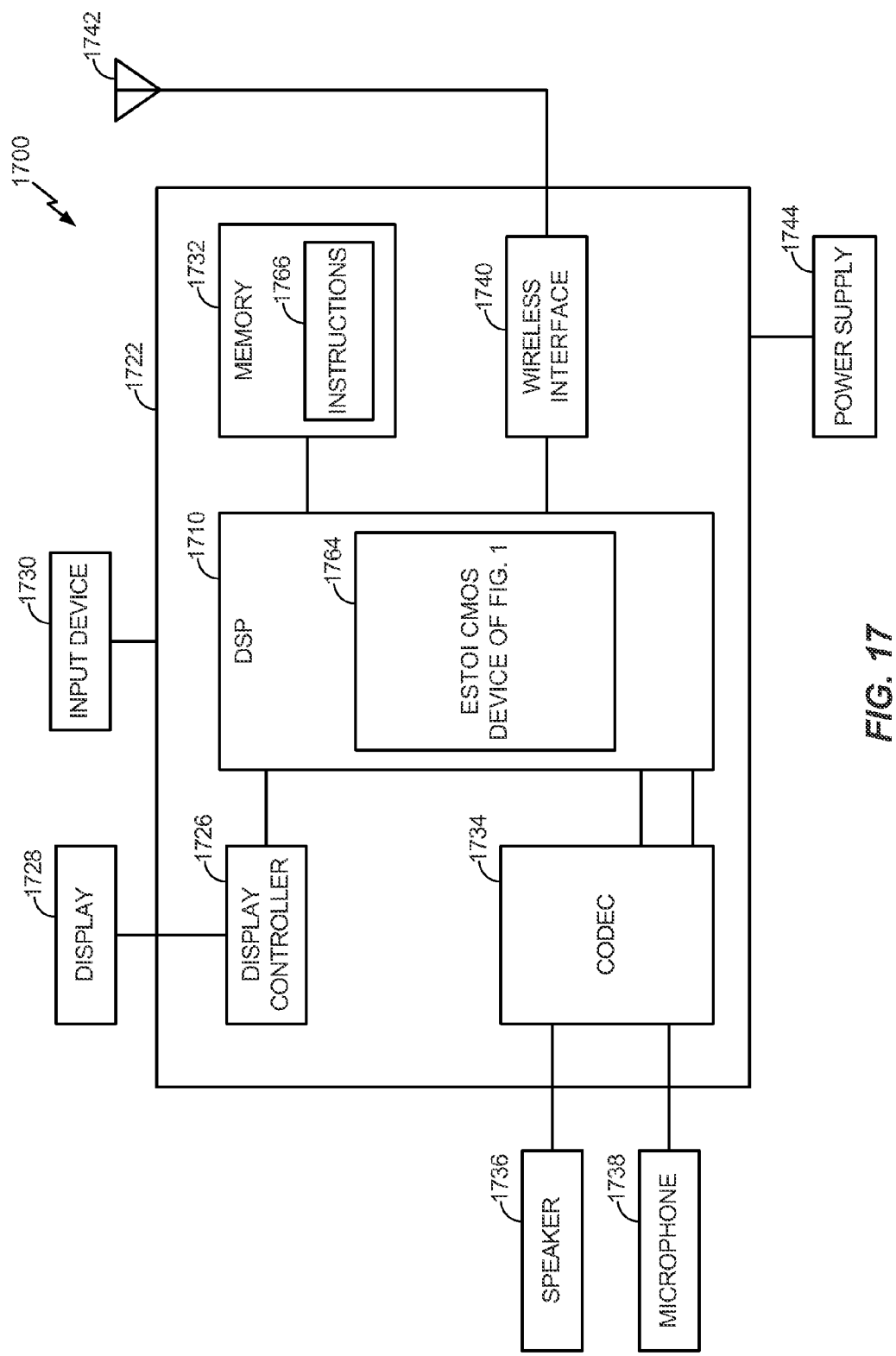
FIG. 17 is a block diagram of a portable device including the complementary metal-oxide-semiconductor (CMOS) device of FIG. 1.

Referring to FIG. 17, a block diagram of a particular illustrative embodiment of a wireless communication device is depicted and generally designated 1700. The device 1700 includes a processor, such as a digital signal processor (DSP) 1710, coupled to a memory 1732. The DSP 1710 may include an ETSOI CMOS device 1764. For example, the ETSOI CMOS device 1764 may be the CMOS device 100 of FIG. 1, a CMOS device formed according to FIGS. 2-12 using at least one of the methods of FIGS. 13-16, or any combination thereof.

In a particular embodiment, the memory 1732 includes instructions 1766 (e.g., executable instructions) such as computer-readable instructions or processor-readable instructions. The instructions 1766 may include one or more instructions that are executable by a computer such as the DSP 1710.

FIG. 17 also shows a display controller 1726 that is coupled to the digital signal processor 1710 and to a display 1728. A coder/decoder (CODEC) 1734 can also be coupled to the digital signal processor 1710. A speaker 1736 and a microphone 1738 can be coupled to the CODEC 1734.

FIG. 17 also indicates that a wireless controller 1740 can be coupled to the digital signal processor 1710 and to a wireless antenna 1742. In a particular embodiment, the DSP 1710, the display controller 1726, the memory 1732, the CODEC 1734, and the wireless controller 1740 are included in a system-in-package or system-on-chip device 1722. In a particular embodiment, an input device 1730 and a power supply 1744 are coupled to the system-on-chip device 1722. Moreover, in a particular embodiment, as illustrated in FIG. 17, the display 1728, the input device 1730, the speaker 1736, the microphone 1738, the wireless antenna 1742, and the power supply 1744 are external to the system-on-chip device 1722. However, each of the display 1728, the input device 1730, the speaker 1736, the microphone 1738, the wireless antenna 1742, and the power supply 1744 can be coupled to a component of the system-on-chip device 1722, such as an interface or a controller.

In conjunction with the described embodiments, a system is disclosed that may include means for sourcing current to a channel, such as the expansion region 120 or the expansion region 164 of FIG. 1, the first layer 220 and/or one of the source/drain regions 442 of FIG. 2, one of the source/drain regions 664 of FIG. 2, one or more other devices or circuits configured to source current to the channel, or any combination thereof. The means for sourcing may be in contact with a semiconducting means for semiconducting charge carriers. The semiconducting means for semiconducting charge carriers may include the extension layer 108 of FIG. 1, the extension layer 208 of FIGS. 2A, 2B, and 3-12, one or more other devices or circuits configured to source current to the channel, or any combination thereof.

The system may also include means for draining current from the channel, such as the expansion region 120 or the expansion region 164 of FIG. 1, the first layer 220 and/or one of the source/drain regions 442 of FIG. 2, one of the source/drain regions 664 of FIG. 2, one or more other devices or circuits configured to drain current from the channel, or any combination thereof. The means for draining may be in contact with the semiconducting means. The system may also include means for gating the channel, such as the gate 150 or the gate 170 of FIG. 1, the gate 1150 or the gate 1170 of FIGS. 11 and 12, one or more other devices or circuits configured to gate the channel, or any combination thereof. The means for gating may be in contact with the channel and in contact with a means for extending a semiconducting path between the channel and the means for sourcing current. The means for extending the semiconducting path may include the expansion region 120 or the expansion region 164 of FIG. 1, the first layer 220 and/or the source/drain regions 442 of FIG. 2, the source/drain regions 664 of FIG. 2, one or more other devices or circuits configured to extend the semiconducting path, or any combination thereof.

The system may further include means for supporting an insulating layer, such as the substrate 104 of FIG. 1, the silicon layer 204 of FIGS. 2A, 2B, and 3-12, one or more other devices or circuits configured to support the insulating layer, or any combination thereof. The means for supporting the insulating layer may include silicon. The system may also include means for electrically insulating the semiconducting means from the means for supporting, such as the dielectric insulator material 106 of FIG. 1, the dielectric layer of FIGS. 2A, 2B, and 3-12, one or more other devices or circuits configured to insulate the semiconducting means form the means for supporting, or any combination thereof. In a particular embodiment, the means for sourcing, the means for draining, and the means for gating are components of a first transistor of a first type and a second transistor of a second type is disposed on the extension layer.

In conjunction with the described embodiments, a method is disclosed that may include a step for forming a first layer on an extension layer of a wafer, such as described in the method of FIG. 13 at 1302, described in the method of FIG. 14 at 1402, described in the method of FIGS. 15 and 16 at 1502, one or more other processes configured to form the first layer on the extension layer of a wafer, or any combination thereof. The method may also include a step for forming a first gate on a portion of the first layer, such as described in the method of FIG. 13 at 1304, described in the method of FIGS. 15 and 16 at 1504, one or more other processes configured to form the first gate on the portion of the first layer, or any combination thereof. The method may also include a step for forming an expansion region above the extension layer, such as the as described in the method of FIG. 13 at 1306, described in the method of FIGS. 15 and 16 at 1508 and 1514, one or more other processes configured to form the expansion region above the extension layer, or any combination thereof.

The method may further include a step for removing a portion of the first gate to establish a cavity, such as the as described in the method of FIG. 13 at 1308, described in the method of FIGS. 15 and 16 at 1612, one or more other processes configured to remove the portion of the first gate to establish the cavity, or any combination thereof. The method may also include a step for removing a portion of the first layer to extend the cavity to the extension layer, such as the as described in the method of FIG. 13 at 1310, described in the method of FIGS. 15 and 16 at 1618, one or more other processes configured to remove the portion of the first layer to extend the cavity to the extension layer, or any combination thereof. The method may also include a step for forming a second gate in the cavity, such as described in the method of FIG. 13 at 1312, described in the method of FIG. 14 at 1404 and 1406, described in the method of FIGS. 15 and 16 at 1620, one or more other processes configured to form the second gate in the cavity, or any combination thereof. In a particular embodiment, the step for forming the first layer, the step for forming the first gate, the step for forming the expansion region, the step for removing the portion of the first gate, and the step for removing the portion of the first layer are initiated by a processor integrated into an electronic device.

Figure 18:
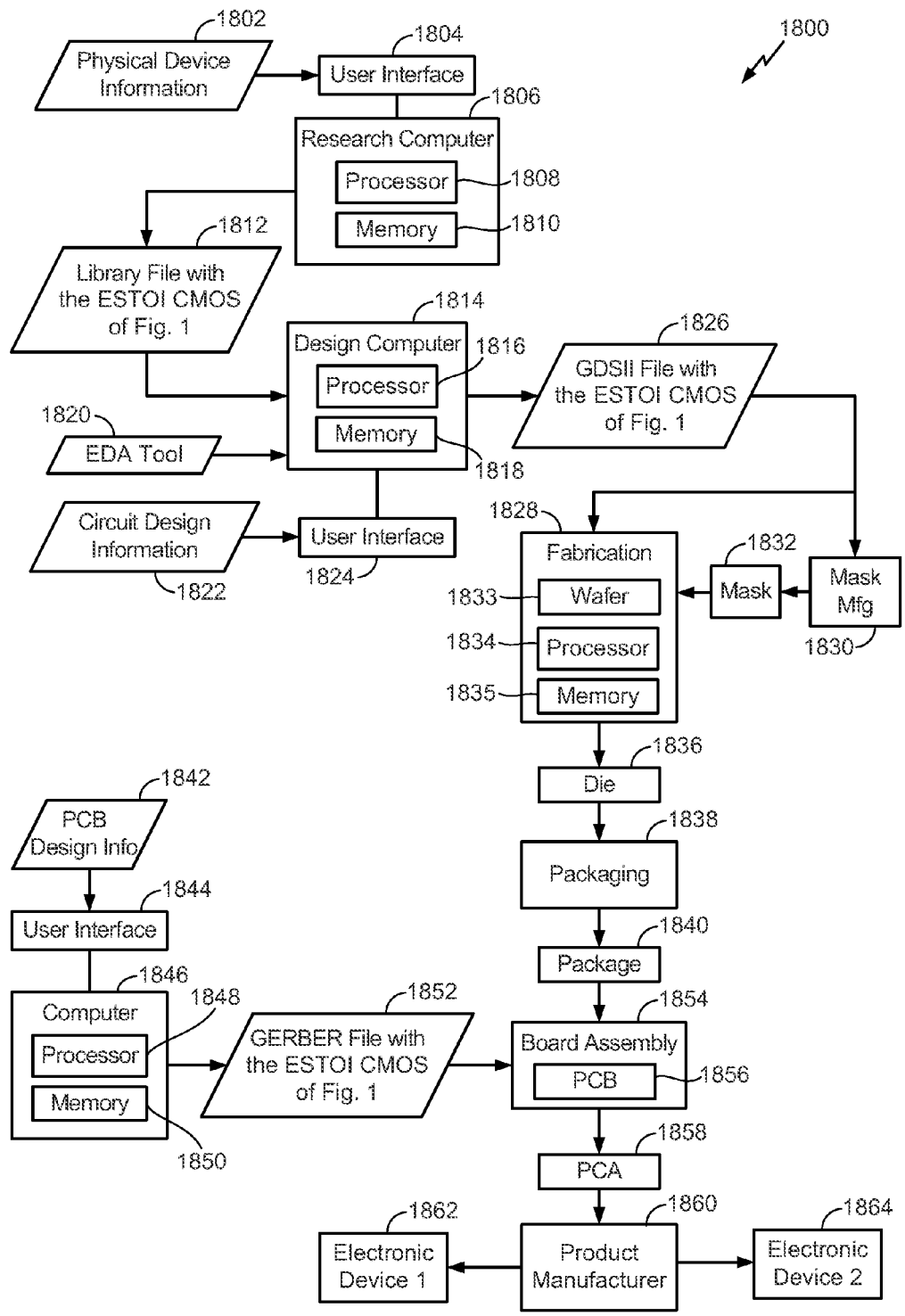
FIG. 18 is a data flow diagram of a particular illustrative embodiment of a manufacturing process to manufacture electronic devices that include the complementary metal-oxide-semiconductor (CMOS) device of FIG. 1.

The foregoing disclosed devices and functionalities (such as the device of FIG. 1, the methods of FIGS. 13-16, or any combination thereof) may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 18 depicts a particular illustrative embodiment of an electronic device manufacturing process 1800.

Physical device information 1802 is received at the manufacturing process 1800, such as at a research computer 1806. The physical device information 1802 may include design information representing at least one physical property of a semiconductor device, such as the CMOS device 100 of FIG. 1, a CMOS device formed using at least one of the methods of FIGS. 13-16, or any combination thereof. For example, the physical device information 1802 may include physical parameters, material characteristics, and structure information that is entered via a user interface 1804 coupled to the research computer 1806. The research computer 1806 includes a processor 1808, such as one or more processing cores, coupled to a computer readable medium such as a memory 1810. The memory 1810 may store computer readable instructions that are executable to cause the processor 1808 to transform the physical device information 1802 to comply with a file format and to generate a library file 1812.

In a particular embodiment, the library file 1812 includes at least one data file including the transformed design information. For example, the library file 1812 may include a library of semiconductor devices including a device that includes the CMOS device 100 of FIG. 1, a CMOS device formed using at least one of the methods of FIGS. 13-16, or any combination thereof, that is provided for use with an electronic design automation (EDA) tool 1820.

The library file 1812 may be used in conjunction with the EDA tool 1820 at a design computer 1814 including a processor 1816, such as one or more processing cores, coupled to a memory 1818. The EDA tool 1820 may be stored as processor executable instructions at the memory 1818 to enable a user of the design computer 1814 to design a circuit including the CMOS device 100 of FIG. 1, a CMOS device formed using at least one of the methods of FIGS. 13-16, or any combination thereof, of the library file 1812. For example, a user of the design computer 1814 may enter circuit design information 1822 via a user interface 1824 coupled to the design computer 1814. The circuit design information 1822 may include design information representing at least one physical property of a semiconductor device, such as the CMOS device 100 of FIG. 1, a CMOS device formed using at least one of the methods of FIGS. 13-16, or any combination thereof. To illustrate, the circuit design property may include identification of particular circuits and relationships to other elements in a circuit design, positioning information, feature size information, interconnection information, or other information representing a physical property of a semiconductor device.

The design computer 1814 may be configured to transform the design information, including the circuit design information 1822, to comply with a file format. To illustrate, the file formation may include a database binary file format representing planar geometric shapes, text labels, and other information about a circuit layout in a hierarchical format, such as a Graphic Data System (GDSII) file format. The design computer 1814 may be configured to generate a data file including the transformed design information, such as a GDSII file 1826 that includes information describing the CMOS device 100 of FIG. 1, a CMOS device formed using at least one of the methods of FIGS. 13-16, or any combination thereof, in addition to other circuits or information. To illustrate, the data file may include information corresponding to a system-on-chip (SOC) that includes the CMOS device 100 of FIG. 1, a CMOS device formed using at least one of the methods of FIGS. 13-16, or any combination thereof, and that also includes additional electronic circuits and components within the SOC.

The GDSII file 1826 may be received at a fabrication process 1828 to manufacture the CMOS device 100 of FIG. 1, a CMOS device formed using at least one of the methods of FIGS. 13-16, or any combination thereof, according to transformed information in the GDSII file 1826. For example, a device manufacture process may include providing the GDSII file 1826 to a mask manufacturer 1830 to create one or more masks, such as masks to be used with photolithography processing, illustrated as a representative mask 1832. The mask 1832 may be used during the fabrication process to generate one or more wafers 1833, which may be tested and separated into dies, such as a representative die 1836. The die 1836 includes a circuit including a device that includes the CMOS device 100 of FIG. 1, a CMOS device formed using at least one of the methods of FIGS. 13-16, or any combination thereof.

The fabrication process 1828 may include a processor 1834 and a memory 1835 to initiate and/or control the fabrication process 1828. The memory 1835 may include executable instructions such as computer-readable instructions or processor-readable instructions. The executable instructions may include one or more instructions that are executable by a computer such as the processor 1834. The executable instructions may enable the processor 1834 to initiate formation of a CMOS device such as the CMOS device 100 of FIG. 1. After formation of the CMOS device is initiated, the CMOS device may be formed using one of the methods of FIGS. 13-16 or any combination thereof. In a particular embodiment, the memory 1835 is a non-transient computer readable medium storing computer-executable instructions that are executable by the processor 1834 to cause the processor 1834 to initiate formation of a complementary metal-oxide-semiconductor (CMOS) device. The computer-executable instructions cause the processor to initiate formation of the CMOS device, where the CMOS may be formed by forming a first layer on an extension layer of a wafer, forming a first gate on a portion of the first layer, forming an expansion region above the extension layer, removing a portion of the first gate to establish a cavity, and removing a portion of the first layer to extend the cavity to the extension layer. The expansion region is formed on the extension layer.

The die 1836 may be provided to a packaging process 1838 where the die 1836 is incorporated into a representative package 1840. For example, the package 1840 may include the single die 1836 or multiple dies, such as a system-in-package (SiP) arrangement. The package 1840 may be configured to conform to one or more standards or specifications, such as Joint Electron Device Engineering Council (JEDEC) standards.

Information regarding the package 1840 may be distributed to various product designers, such as via a component library stored at a computer 1846. The computer 1846 may include a processor 1848, such as one or more processing cores, coupled to a memory 1850. A printed circuit board (PCB) tool may be stored as processor executable instructions at the memory 1850 to process PCB design information 1842 received from a user of the computer 1846 via a user interface 1844. The PCB design information 1842 may include physical positioning information of a packaged semiconductor device on a circuit board, the packaged semiconductor device corresponding to the package 1840 including the CMOS device 100 of FIG. 1, a CMOS device formed using at least one of the methods of FIGS. 13-16, or any combination thereof.

The computer 1846 may be configured to transform the PCB design information 1842 to generate a data file, such as a GERBER file 1852 with data that includes physical positioning information of a packaged semiconductor device on a circuit board, as well as layout of electrical connections such as traces and vias, where the packaged semiconductor device corresponds to the package 1840 including the CMOS device 100 of FIG. 1, a CMOS device formed using at least one of the methods of FIGS. 13-16, or any combination thereof. In other embodiments, the data file generated by the transformed PCB design information may have a format other than a GERBER format.

The GERBER file 1852 may be received at a board assembly process 1854 and used to create PCBs, such as a representative PCB 1856, manufactured in accordance with the design information stored within the GERBER file 1852. For example, the GERBER file 1852 may be uploaded to one or more machines to perform various steps of a PCB production process. The PCB 1856 may be populated with electronic components including the package 1840 to form a representative printed circuit assembly (PCA) 1858.

The PCA 1858 may be received at a product manufacture process 1860 and integrated into one or more electronic devices, such as a first representative electronic device 1862 and a second representative electronic device 1864. As an illustrative, non-limiting example, the first representative electronic device 1862, the second representative electronic device 1864, or both, may be selected from the group of a set top box, an entertainment unit, a navigation device, a communications device, a personal digital assistant (PDA), a fixed location data unit, a mobile location data unit, a mobile phone, a cellular phone, a computer, a portable computer, a desktop computer, a monitor, a computer monitor, a television, a tuner, a radio, a satellite radio, a music player, a digital music player, a portable music player, a video player, a digital video player, a digital video disc (DVD) player, and a portable digital video player, into which the CMOS device 100 of FIG. 1, a CMOS device formed using at least one of the methods of FIGS. 13-16, or any combination thereof, is integrated. As another illustrative, non-limiting example, one or more of the electronic devices 1862 and 1864 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 18 illustrates remote units according to teachings of the disclosure, the disclosure is not limited to these illustrated units. Embodiments of the disclosure may be suitably employed in any device which includes active integrated circuitry including memory and on-chip circuitry.

A device that includes the CMOS device 100 of FIG. 1, a CMOS device formed using at least one of the methods of FIGS. 13-16, or any combination thereof, may be fabricated, processed, and incorporated into an electronic device, as described in the illustrative process 1800. One or more aspects of the embodiments disclosed with respect to FIGS. 1-17 may be included at various processing stages, such as within the library file 1812, the GDSII file 1826, and the GERBER file 1852, as well as stored at the memory 1810 of the research computer 1806, the memory 1818 of the design computer 1814, the memory 1850 of the computer 1846, the memory of one or more other computers or processors (not shown) used at the various stages, such as at the board assembly process 1854, and also incorporated into one or more other physical embodiments such as the mask 1832, the die 1836, the package 1840, the PCA 1858, other products such as prototype circuits or devices (not shown), or any combination thereof. Although various representative stages of production from a physical device design to a final product are depicted, in other embodiments fewer stages may be used or additional stages may be included. Similarly, the process 1800 may be performed by a single entity or by one or more entities performing various stages of the process 1800.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A complementary metal-oxide-semiconductor (CMOS) device comprising:
a substrate;
a dielectric insulator material on the substrate;
an extension layer on the dielectric insulator material, wherein the extension layer comprises a first implants region, a second implants region, and a channel region;
a first expansion region on the first implants region, wherein the first expansion region forms a first conducting path between a source and the first implants region;
a second expansion region on the second implants region, wherein the second expansion region forms a second conducting path between a drain and the second implants region; and
a gate stack in contact with the channel region, the first expansion region, the second expansion region, the first implants region, and the second implants region,
wherein the gate stack comprises a gate electrode and a gate dielectric layer,
wherein the first expansion region and the second expansion region comprise undoped semiconducting material, and
wherein the first expansion region and the second expansion region are thicker than the channel region to reduce resistance.

2. The CMOS device of claim 1, further comprising a first spacer between the gate and the source and a second spacer between the gate and the drain.

3. The CMOS device of claim 1, wherein the substrate includes silicon.

4. The CMOS device of claim 1, wherein the first expansion region and the second expansion region include silicon germanium.

5. The CMOS device of claim 1, wherein the first expansion region and the second expansion region include one of silicon and silicon carbon.

6. The CMOS device of claim 1, wherein a thickness of the channel region is less than a thickness of the first expansion region and is less than a thickness of the second expansion region.

7. The CMOS device of claim 1, wherein the gate, the source, and the drain are components of a first transistor of a first type and wherein a second transistor of a second type is disposed on the extension layer.

8. The CMOS device of claim 7, wherein the first type is a p-type and wherein the second type is an n-type.

9. The CMOS device of claim 1, wherein the first expansion region is coupled with the source, the gate, and the first electrode, wherein the source is biased via the first electrode during operation of the CMOS device, wherein the second expansion region is coupled with the drain, the gate, and the second electrode, and wherein the drain is biased via the second electrode during operation of the CMOS device.

10. The CMOS device of claim 1, wherein the first expansion region under a first spacer and the second expansion region under a second spacer are thicker than the channel region to reduce the resistance in the first expansion region and the second expansion region.

11. A complementary metal-oxide-semiconductor (CMOS) device comprising:
means for supporting layers;
means for electrically insulating positioned on the means for supporting the layers;

means for semiconducting charge carriers, wherein the means for semiconducting charge carriers comprises a first implants region, a second implants region, and the channel;

means for gating positioned on the channel;

first means for extending a first conducting path between the first implants region and a source; and second means for extending a second conducting path between the second implants region and a drain, wherein the first means for extending and the second means for extending comprise undoped semiconducting material, and wherein the first means for extending and the second means for extending are thicker than the channel to reduce resistance.

12. The CMOS device of claim 11, wherein the source, the drain, and the means for gating are components of a first transistor of a first type and wherein a second transistor of a second type is disposed on the means for semiconducting.

13. The CMOS device of claim 11, wherein the first means for extending is coupled with the source, the gate, and the first electrode, wherein the source is biased via the first electrode during operation of the CMOS device, wherein the second means for extending is coupled with the drain, the means for gating, and the second electrode, and wherein the drain is biased via the second electrode during operation of the CMOS device.

* * * * *